US008779433B2

(12) United States Patent
Isobe et al.

(10) Patent No.: US 8,779,433 B2
(45) Date of Patent: Jul. 15, 2014

(54) SEMICONDUCTOR DEVICE

(75) Inventors: Atsuo Isobe, Kanagawa (JP); Yoshinori Ieda, Kanagawa (JP); Kiyoshi Kato, Kanagawa (JP); Yuto Yakubo, Kanagawa (JP); Yuki Hata, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 80 days.

(21) Appl. No.: 13/115,239

(22) Filed: May 25, 2011

(65) Prior Publication Data

US 2011/0298027 A1    Dec. 8, 2011

(30) Foreign Application Priority Data

Jun. 4, 2010    (JP) .................................. 2010-129181

(51) Int. Cl.
| H01L 29/10 | (2006.01) |
| H01L 27/115 | (2006.01) |
| H01L 27/108 | (2006.01) |

(52) U.S. Cl.
CPC ...... *H01L 27/1156* (2013.01); *H01L 27/10852* (2013.01)
USPC ............... 257/67; 257/E25.013; 257/E25.021

(58) Field of Classification Search
CPC ...................... H01L 27/1156; H01L 27/10852
USPC .............................. 257/67, E25.013, E25.021
See application file for complete search history.

(56) References Cited

U.S. PATENT DOCUMENTS

| 4,466,081 A | 8/1984 | Masuoka |
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |

(Continued)

FOREIGN PATENT DOCUMENTS

| EP | 1 737 044 A1 | 12/2006 |
| EP | 2 226 847 A2 | 9/2010 |

(Continued)

OTHER PUBLICATIONS

Ohara, H et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

(Continued)

*Primary Examiner* — Amar Movva
(74) *Attorney, Agent, or Firm* — Fish & Richardson P.C.

(57) ABSTRACT

It is an object to provide a semiconductor device with a novel structure in which stored data can be held even when power is not supplied and there is no limitation on the number of writings. A semiconductor device includes a second transistor and a capacitor provided over a first transistor. A source electrode of the second transistor which is in contact with a gate electrode of the first transistor is formed using a material having etching selectivity with respect to the gate electrode. By forming the source electrode of the second transistor using a material having etching selectivity with respect to the gate electrode of the first transistor, a margin in layout can be reduced, so that the degree of integration of the semiconductor device can be increased.

30 Claims, 16 Drawing Sheets

(56) References Cited

U.S. PATENT DOCUMENTS

| | | |
|---|---|---|
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0101351 A1 | 5/2011 | Yamazaki |
| 2011/0157961 A1 | 6/2011 | Yamazaki et al. |
| 2011/0175083 A1 | 7/2011 | Sekine et al. |
| 2011/0175087 A1 | 7/2011 | Yamazaki et al. |
| 2011/0176348 A1 | 7/2011 | Yamazaki et al. |
| 2011/0176354 A1 | 7/2011 | Yamazaki et al. |
| 2011/0176355 A1 | 7/2011 | Furutani et al. |
| 2011/0194327 A1 | 8/2011 | Kawae |
| 2011/0194331 A1 | 8/2011 | Kawae et al. |
| 2011/0198593 A1 | 8/2011 | Kato et al. |
| 2011/0199807 A1 | 8/2011 | Saito et al. |
| 2011/0199816 A1 | 8/2011 | Inoue et al. |
| 2011/0205785 A1 | 8/2011 | Nagatsuka et al. |
| 2011/0210339 A1 | 9/2011 | Yamazaki et al. |
| 2011/0215317 A1 | 9/2011 | Yamazaki et al. |
| 2011/0220891 A1 | 9/2011 | Fujii et al. |
| 2011/0227072 A1 | 9/2011 | Inoue et al. |
| 2011/0227074 A1 | 9/2011 | Kato et al. |
| 2011/0255325 A1 | 10/2011 | Nagatsuka et al. |
| 2011/0280061 A1 | 11/2011 | Saito et al. |
| 2011/0297928 A1 | 12/2011 | Isobe et al. |
| 2012/0074407 A1 | 3/2012 | Yamazaki et al. |

FOREIGN PATENT DOCUMENTS

| | | |
|---|---|---|
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | 2004/114391 A1 | 12/2004 |

OTHER PUBLICATIONS

Orita, M et al., "Amorphous transplant conductive oxide InGaO3(ZnO)m (m<4):a Zn4s conductor", Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn-Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn-Oxide TFT," AM-FPD '09 Digest of Technical Papers, Jul. 1, 2009, pp. 33-36.

(56) References Cited

OTHER PUBLICATIONS

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-in. AMOLED Display With Driver Circuit Using Amorphous In—Ga—Zn-Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: AL and SN-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn-Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

(56) References Cited

OTHER PUBLICATIONS

Kimizuka, N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] at Temperatures Over 1000° C," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," Nirim Newsletter, Mar. 1995, vol. 150, pp. 1-4 with English translation.

Nakamura, M et al., "The phase relations in the In2O3—Ga2ZnO4—ZnO system at 1350° C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In—Ga—Zn-Oxide TFTs With a Novel Passivation Layer," SID Digest '09 : SID International Symposium Digest of Technical Papers, May 31, 2009, pp. 284-287.

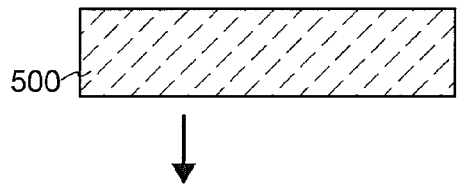
FIG. 7A
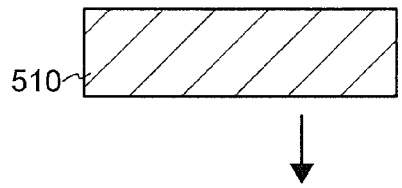
FIG. 7C
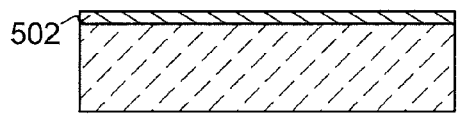
FIG. 7B
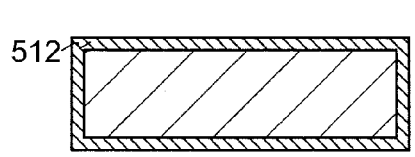
FIG. 7D
FIG. 7E
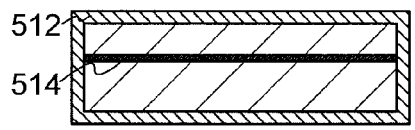
FIG. 7F
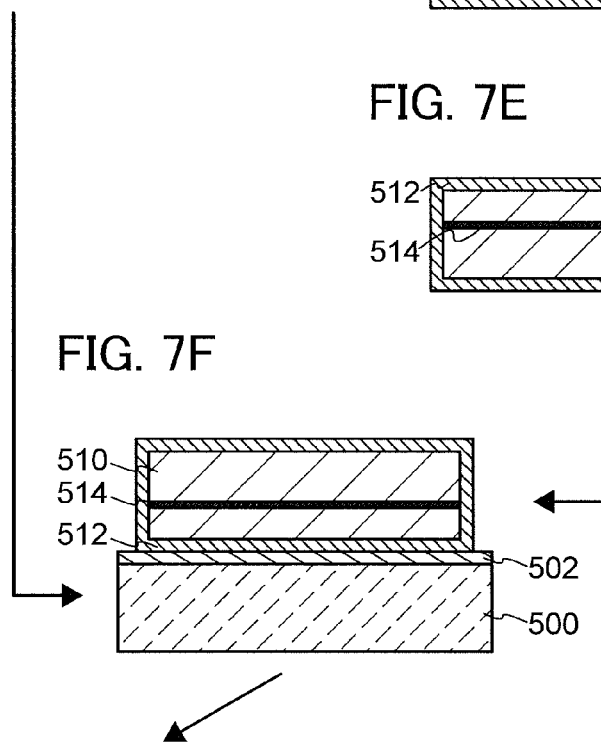
FIG. 7G
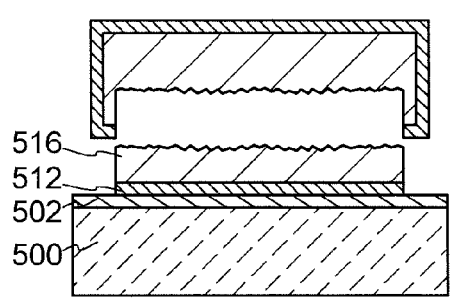
FIG. 7H
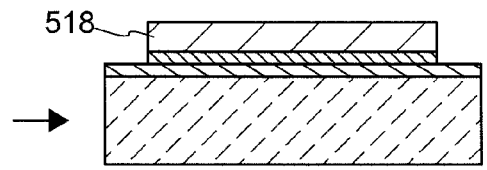

SEMICONDUCTOR DEVICE

BACKGROUND OF THE INVENTION

1. Field of the Invention

An embodiment of the invention disclosed herein relates to a semiconductor device using a semiconductor element and a method for manufacturing the semiconductor device.

2. Description of the Related Art

Storage devices using semiconductor elements are broadly classified into two kinds of devices: a volatile device that loses stored data when power is not supplied, and a non-volatile device that holds stored data even when power is not supplied.

A typical example of a volatile storage device is a dynamic random access memory (DRAM). A DRAM stores data in such a manner that a transistor included in a storage element is selected and charge is stored in a capacitor.

When data is read from a DRAM, charge in a capacitor is lost from the above-described principle; thus, another writing operation is necessary whenever data is read. Moreover, a transistor included in a storage element has a leakage current (off-state current) between a source and a drain in an off state or the like and charge flows into or out of a capacitor even if the transistor is not selected, whereby a data holding period is short. For that reason, another writing operation (refresh operation) is necessary at predetermined intervals, and it is difficult to sufficiently reduce power consumption. Furthermore, since stored data is lost when power is not supplied, an additional storage device using a magnetic material or an optical material is needed in order to hold data for a long time.

Another example of a volatile storage device is a static random access memory (SRAM). An SRAM holds stored data by using a circuit such as a flip-flop and thus does not need refresh operation. This means that an SRAM has an advantage over a DRAM. However, cost per storage capacity is increased because a circuit such as a flip-flop is used. Moreover, as in a DRAM, stored data in an SRAM is lost when power is not supplied.

A typical example of a non-volatile storage device is a flash memory. A flash memory includes a floating gate between a gate electrode and a channel formation region in a transistor and stores data by holding charge in the floating gate. Therefore, a flash memory has advantages in that a data holding period is extremely long (almost permanent) and refresh operation which is necessary in a volatile storage device is not needed (e.g., see Patent Document 1).

However, a gate insulating layer included in a storage element deteriorates by tunneling current generated in writing, so that the storage element stops its function after a certain number of writings. In order to reduce adverse effects of this problem, a method in which the number of writing operations for storage elements is equalized is employed, for example. However, a complicated peripheral circuit is needed to realize this method. Moreover, employing such a method does not solve the fundamental problem of lifetime. That is, a flash memory is not suitable for applications in which data is frequently rewritten.

In addition, high voltage is necessary for injection of charge into a floating gate or removal of the charge, and a circuit for generating high voltage is also necessary. Further, it takes a relatively long time to inject or remove charge, and it is not easy to increase the speed of writing or erasing data.

REFERENCE

Patent Document

[Patent Document 1] Japanese Published Patent Application No. S57-105889

SUMMARY OF THE INVENTION

In view of the foregoing problems, it is an object of an embodiment of the invention disclosed herein to provide a semiconductor device with a novel structure in which stored data can be held even when power is not supplied, and does not have a limitation on the number of writings. Further, it is an object of an embodiment of the invention disclosed herein to provide a semiconductor device with an increased degree of integration.

In the invention disclosed herein, a semiconductor device is formed with the use of a transistor whose off-state current is small. As such a transistor, for example, a transistor including an oxide semiconductor, further, a transistor including a highly purified oxide semiconductor can be used. The transistor including an oxide semiconductor has small leakage current. In addition, by using a highly purified oxide semiconductor, the leakage current can be further reduced, so that data can be held for a long time.

According to an embodiment of the present invention, a semiconductor device includes: a first transistor and a second transistor at least part of which overlaps with the first transistor. The first transistor includes a first channel formation region, a first gate insulating layer provided over the first channel formation region, a first gate electrode provided over the first gate insulating layer so as to overlap with the first channel formation region, and a first source electrode and a first drain electrode electrically connected to the first channel formation region. The second transistor includes: a second channel formation region, a second source electrode and a second drain electrode electrically connected to the second channel formation region, a second gate electrode provided so as to overlap with the second channel formation region, and a second gate insulating layer provided between the second channel formation region and the second gate electrode. The second source electrode is formed of a material having etching selectivity with respect to the first gate electrode, and one of lower end portions of the second source electrode is provided in contact with an upper surface of the first gate electrode.

According to another embodiment of the present invention, a semiconductor device includes: a plurality of memory cells each including a first transistor, a second transistor at least part of which overlaps with the first transistor, and a capacitor. The first transistor includes: a first channel formation region, a first gate insulating layer provided over the first channel formation region, a first gate electrode provided over the first gate insulating layer so as to overlap with the first channel formation region, and a first source electrode and a first drain electrode electrically connected to the first channel formation region. The second transistor includes: a second channel formation region, a second source electrode and a second drain electrode electrically connected to the second channel formation region, a second gate electrode provided so as to overlap with the second channel formation region, and a second gate insulating layer provided between the second channel formation region and the second gate electrode. The second source electrode is formed of a material having etching selectivity with respect to the first gate electrode, and one of lower end portions of the second source electrode is provided in contact with an upper surface of the first gate electrode. The first gate electrode, the second source electrode, and one electrode of the capacitor are electrically connected to each other.

In the above semiconductor device, the first channel formation region preferably contains silicon.

In the above semiconductor device, the second channel formation region preferably contains an oxide semiconductor.

In the above semiconductor device, the etching selectivity of the second source electrode with respect to the first gate electrode is preferably greater than or equal to 2.

Note that in this specification and the like, "to have etching selectivity" means that, for example, in performing etching of a layer A and a layer B which are stacked, the etching rate of the layer A and the etching rate of the layer B are sufficiently different from each other.

Further, in this specification and the like, the terms "over" and "below" do not necessarily mean "directly on" and "directly under", respectively, in the description of a positional relationship between components. For example, the expression "a gate electrode over a gate insulating layer" can mean the case where there is an additional component between the gate insulating layer and the gate electrode.

In addition, in this specification and the like, the term "electrode" or "wiring" does not limit a function of such a component. For example, an "electrode" is sometimes used as part of a "wiring", and vice versa. Furthermore, the term "electrode" or "wiring" can include the case where a plurality of "electrodes" or "wirings" are formed in an integrated manner.

Functions of "source" and "drain" are sometimes replaced with each other when a transistor of opposite polarity is used or when the direction of current flowing is changed in circuit operation, for example. Therefore, the terms "source" and "drain" can be replaced with each other in this specification and the like.

Note that in this specification and the like, the term "electrically connected" includes the case where components are connected through an object having any electric function. There is no particular limitation on an object having any electric function as long as electric signals can be transmitted and received between components that are connected through the object. Examples of an "object having any electric function" are a switching element such as a transistor, a resistor, an inductor, a capacitor, and an element with a variety of functions as well as an electrode and a wiring.

Since the off-state current of a transistor including an oxide semiconductor is extremely small, stored data can be held for an extremely long time by using such a transistor. In other words, power consumption can be adequately reduced because refresh operation becomes unnecessary or the frequency of refresh operation can be extremely low. Moreover, stored data can be held for a long time even when power is not supplied.

Further, a semiconductor device according to an embodiment of the present invention does not need high voltage for writing data, and deterioration of the element does not become a problem. For example, unlike a conventional non-volatile memory, it is not necessary to inject and extract electrons into and from a floating gate, and thus, a problem such as deterioration of a gate insulating layer does not arise at all. That is, the semiconductor device according to an embodiment of the present invention does not have a limitation on the number of rewritings, which has been a problem of a conventional non-volatile memory, and thus has significantly improved reliability. Furthermore, since data is written by turning on or off the transistor, high-speed operation can be easily realized. In addition, there is an advantage such as no need of operation for erasing data.

Since a transistor including a material other than an oxide semiconductor can operate at sufficiently high speed, a semiconductor device can perform operation (e.g., reading data) at sufficiently high speed by using such a transistor in combination with a transistor including an oxide semiconductor. Further, a transistor including a material other than an oxide semiconductor can favorably realize a variety of circuits (such as a logic circuit or a driver circuit) which are required to operate at high speed.

Thus, a semiconductor device having a novel feature can be realized by being provided with both a transistor including a material other than an oxide semiconductor capable of operation at sufficiently high speed and a transistor including an oxide semiconductor (a transistor whose off-state current is sufficiently small, in general).

Further, in an embodiment of the present invention, a surface of a gate electrode of a transistor in a lower portion (a transistor including a material other than an oxide semiconductor) and a source electrode of a transistor in an upper portion (a transistor including an oxide semiconductor) which is provided on and in contact with the gate electrode are formed by using materials with which the source electrode has etching selectivity with respect to the gate electrode. Accordingly, the gate electrode of the transistor in the lower portion is not etched when a pattern of the source electrode of the transistor in the upper portion is formed, so that a margin of the source electrode for covering the gate electrode is not necessary. Therefore, the layout area can be reduced, and a semiconductor device with an increased degree of integration can be provided.

BRIEF DESCRIPTION OF THE DRAWINGS

FIGS. 7A to 7H are cross-sectional views illustrating a manufacturing process of a semiconductor device.

DETAILED DESCRIPTION OF THE INVENTION

Figure 1A:
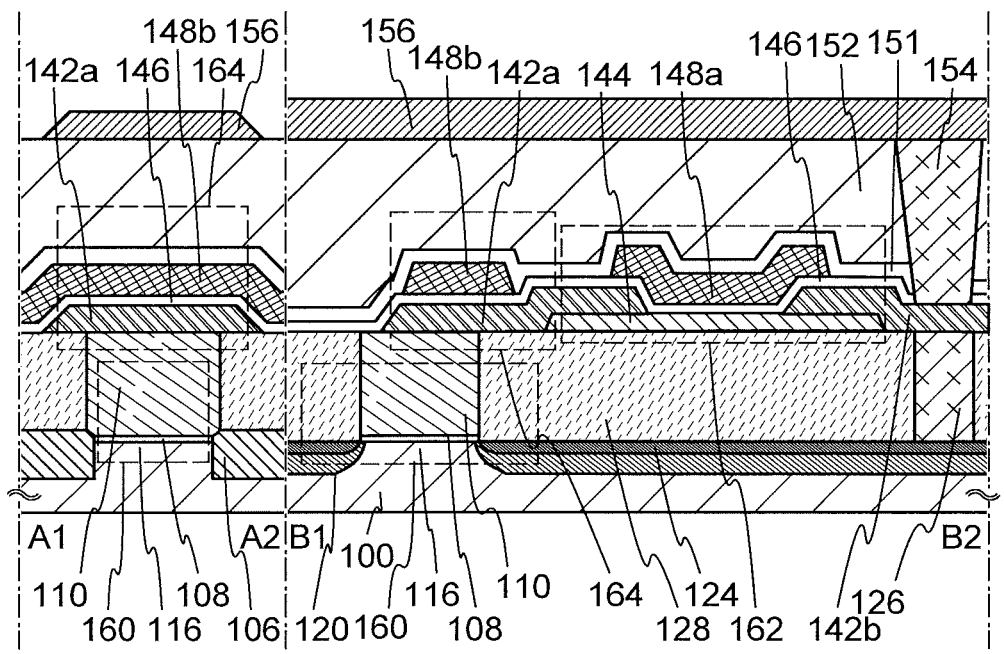
FIGS. 1A and 1B are a cross-sectional view and a plan view of a semiconductor device.

Hereinafter, embodiments of the present invention will be described with reference to the drawings. Note that the present invention is not limited to the following description and it will be easily understood by those skilled in the art that modes and details thereof can be modified in various ways without departing from the spirit and the scope of the present invention. Therefore, the present invention should not be construed as being limited to the description of the following embodiments. In the embodiments below, the same portions or portions having similar functions are denoted by the same reference numerals in different drawings, and explanation thereof will not be repeated.

Note that the position, the size, the range, or the like of each structure illustrated in the drawings and the like is not accurately represented in some cases for easy understanding. Therefore, the invention disclosed herein is not necessarily limited to the position, the size, the range, or the like disclosed in the drawings and the like.

In this specification and the like, ordinal numbers such as "first", "second", and "third" are used in order to avoid confusion among components, and the terms do not limit the components numerically.

Embodiment 1

In this embodiment, a structure of a semiconductor device according to an embodiment of the present invention and a method for manufacturing the semiconductor device will be described with reference to FIGS. 1A and 1B, FIGS. 2A to 2D, FIGS. 3A to 3D, FIGS. 4A to 4C, and FIGS. 5A to 5C.
<Cross-Sectional Structure and Planar Structure of Semiconductor Device>

Figure 1B:
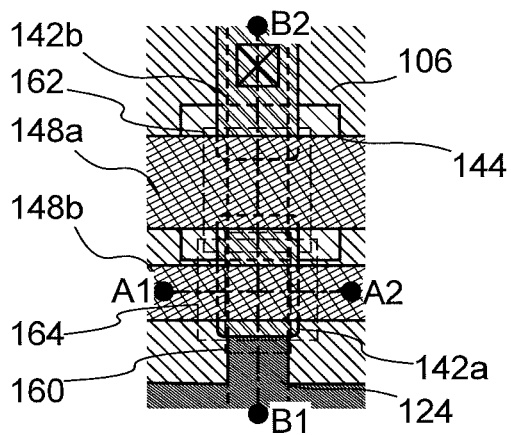

FIGS. 1A and 1B illustrate an example of a structure of a semiconductor device. FIG. 1A is a cross-sectional view of the semiconductor device, and FIG. 1B is a plan view of the semiconductor device. Here, FIG. 1A corresponds to a cross section along line A1-A2 and line B1-B2 in FIG. 1B. The semiconductor device illustrated in FIGS. 1A and 1B includes a transistor 160 including a first semiconductor material in a lower portion, and a transistor 162 including a second semiconductor material in an upper portion. Here, the first semiconductor material is preferably different from the second semiconductor material. For example, a semiconductor material other than an oxide semiconductor can be used as the first semiconductor material, and an oxide semiconductor can be used as the second semiconductor material. The semiconductor material other than an oxide semiconductor can be, for example, silicon, germanium, silicon germanium, silicon carbide, indium phosphide, or gallium arsenide, and a single crystal semiconductor is preferably used. A transistor including such a semiconductor material other than an oxide semiconductor can operate at high speed easily. On the other hand, a transistor including an oxide semiconductor can hold charge for a long time owing to its characteristics.

Although all the above transistors are n-channel transistors here, it is needless to say that p-channel transistors can be used. The technical feature of the invention disclosed herein lies in the use of a semiconductor material with which off-state current can be sufficiently reduced, such as an oxide semiconductor, in the transistor 162 in order to hold data. Therefore, it is not necessary to limit specific conditions, such as a material, a structure, or the like of the semiconductor device, to those given here.

The transistor 160 illustrated in FIGS. 1A and 1B includes a channel formation region 116 provided in a substrate 100 including a semiconductor material (e.g., silicon), impurity regions 120 with the channel formation region 116 provided therebetween, metal compound regions 124 in contact with the impurity regions 120, a gate insulating layer 108 provided over the channel formation region 116, and a gate electrode 110 provided over the gate insulating layer 108. Note that a transistor whose source electrode and drain electrode are not illustrated in a drawing may also be referred to as a transistor for the sake of convenience. Further, in such a case, in description of a connection of a transistor, a source region and a source electrode are collectively referred to as a "source electrode," and a drain region and a drain electrode are collectively referred to as a "drain electrode". That is, in this specification, the term "source electrode" may include a source region.

An electrode 126 is connected to part of the metal compound region 124 of the transistor 160. Here, the electrode 126 functions as a source electrode or a drain electrode of the transistor 160. Further, an element isolation insulating layer 106 is formed on the substrate 100 so as to surround the transistor 160, and an insulating layer 128 is provided over the transistor 160. Note that in order to obtain higher integration, the transistor 160 preferably does not have a sidewall insulating layer as illustrated in FIGS. 1A and 1B. On the other hand, in the case where characteristics of the transistor 160 are emphasized, a sidewall insulating layer may be provided on a side surface of the gate electrode 110, and the impurity region 120 may include an impurity region having a different impurity concentration provided in a region overlapping with the sidewall insulating layer.

The transistor 162 in FIGS. 1A and 1B includes a source electrode (or a drain electrode) 142a and a drain electrode (or a source electrode) 142b which are provided over the insulating layer 128, an oxide semiconductor layer 144 electrically connected to the source electrode 142a and the drain electrode 142b, a gate insulating layer 146 covering the source electrode 142a, the drain electrode 142b, and the oxide semiconductor layer 144, and a gate electrode 148a provided over the gate insulating layer 146 so as to overlap with the oxide semiconductor layer 144.

In the transistor 162, one of lower end portions of the source electrode 142a (here, one side of the bottom surface of the source electrode 142a or a region of the one side) is provided in contact with an upper surface of the gate electrode 110 of the transistor 160. For example, in FIGS. 1A and 1B, in a direction of the cross section along line B1-B2, one of the lower end portions of the source electrode 142a is provided in contact with the upper surface of the gate electrode 110. Note that an embodiment of the present invention is not limited the structure illustrated in FIGS. 1A and 1B. For example, in a direction of the cross section along line A1-A2, one of the lower end portions of the source electrode 142a may be provided in contact with the upper surface of the gate electrode 110. Alternatively, in each of a direction of the cross section along line A1-A2 and a direction of the cross section along line B1-B2, the lower end portion of the source electrode 142a may be provided in contact with the upper surface of the gate electrode 110.

In the transistor 162, the source electrode 142a provided on and in contact with the gate electrode 110 of the transistor 160 in the lower portion is formed using a material having etching selectivity with respect to the gate electrode 110. It can also be said that the etching selectivity of a material for forming the source electrode 142a with respect to the gate electrode 110 is high. More specifically, the etching rate of the source electrode 142a is preferably greater than or equal to twice the etching rate of the gate electrode 110, more preferably greater than or equal to three times the etching rate of the gate electrode 110. That is, the etching selectivity of the source electrode 142a with respect to the gate electrode 110 is preferably greater than or equal to 2, more preferably greater than or equal to 3. By selecting such a material, it is not necessary to provide a margin of the source electrode 142a for covering the gate electrode 110 in consideration of misalignment of a pattern of the source electrode 142a, whereby the layout area can be reduced.

For example, when the source electrode 142a is formed using a material having etching selectivity with respect to the gate electrode 110, it is possible to design a structure in which the upper end portion of the gate electrode 110 corresponds to the lower end portion of the source electrode 142a. In that case, as illustrated in FIGS. 1A and 1B, the lower end portion of the source electrode 142a may be provided over the gate electrode 110 so as to overlap with the gate electrode 110 by misalignment of a pattern of the source electrode 142a. However, since the source electrode 142a is formed using a material having etching selectivity with respect to the gate electrode 110, a pattern of the source electrode 142a can be formed without adverse effect to the gate electrode 110.

In addition, in the transistor 162, it is preferable that the oxide semiconductor layer 144 be highly purified by sufficient removal of impurities such as hydrogen or sufficient supply of oxygen. Specifically, the hydrogen concentration of the oxide semiconductor layer 144 is less than or equal to $5 \times 10^{19}$ atoms/cm$^3$, preferably less than or equal to $5 \times 10^{18}$ atoms/cm$^3$, more preferably less than or equal to $5 \times 10^{17}$ atoms/cm$^3$. Note that the hydrogen concentration of the oxide semiconductor layer 144 is measured by secondary ion mass spectrometry (SIMS). In the oxide semiconductor layer 144 which is highly purified by sufficiently reducing the hydrogen concentration therein and in which defect levels in an energy gap due to oxygen deficiency are reduced by supplying a sufficient amount of oxygen, the carrier concentration due to a donor or an acceptor is less than $1 \times 10^{12}$/cm$^3$, preferably less than $1 \times 10^{11}$/cm$^3$, more preferably less than $1.45 \times 10^{10}$/cm$^3$. In this manner, by using an oxide semiconductor which is made to be an i-type (intrinsic) oxide semiconductor or a substantially i-type oxide semiconductor, the transistor 162 which has extremely favorable off-state current characteristics can be obtained.

A capacitor 164 in FIGS. 1A and 1B includes the source electrode 142a, the gate insulating layer 146, and an electrode 148b. In other words, the source electrode 142a functions as one electrode of the capacitor 164, and the electrode 148b functions as the other electrode of the capacitor 164.

The capacitor 164 may include the oxide semiconductor layer 144 in addition to the gate insulating layer 146.

In this embodiment, the transistor 160 and the transistor 162 are provided to overlap with each other at least partly. In addition, the transistor 162 and the capacitor 164 are provided to overlap with the transistor 160. For example, the electrode 148b of the capacitor 164 is provided to overlap with the gate electrode 110 of the transistor 160 at least partly. By employing such a planar layout, higher integration is possible.

Note that in the transistor 162 and the capacitor 164, the source electrode 142a and the drain electrode 142b preferably have tapered end portions. When the end portions of the source electrode 142a and the drain electrode 142b are tapered, the coverage with the gate insulating layer 146 can be improved and breaking thereof can be prevented. Here, a taper angle is, for example, greater than or equal to 30° and less than or equal to 60°. Note that the "taper angle" means an angle formed by the side surface and the bottom surface of a layer having a tapered shape (for example, the source electrode 142a) when observed from a direction perpendicular to a cross section thereof (a plane perpendicular to the substrate surface).

An insulating layer 151 is provided over the transistor 162 and the capacitor 164, and an insulating layer 152 is provided over the insulating layer 151. An electrode 154 is provided in an opening formed in the gate insulating layer 146, the insulating layer 151, the insulating layer 152, and the like, and a wiring 156 is formed over the insulating layer 152 to be connected to the electrode 154. The wiring 156 electrically connects one memory cell to another memory cell. Note that although the metal compound region 124, the drain electrode 142b, and the wiring 156 are connected to each other through the electrode 126 and the electrode 154 in FIGS. 1A and 1B, the invention disclosed herein is not limited thereto. For example, the drain electrode 142b may be in direct contact with the metal compound region 124. Alternatively, the wiring 156 may be in direct contact with the drain electrode 142b.

Note that in FIGS. 1A and 1B, the electrode 126 for connecting the metal compound region 124 to the drain electrode 142b and the electrode 154 for connecting the drain electrode 142b to the wiring 156 overlap with each other. In other words, a region where the electrode 126 functioning as a source electrode or a drain electrode of the transistor 160 is in contact with the drain electrode 142b of the transistor 162 overlaps with a region where the drain electrode 142b of the transistor 162 is in contact with the electrode 154. Such a layout allows an increase in the degree of integration.

<Method for Manufacturing Semiconductor Device>

Next, an example of a method for manufacturing the semiconductor device will be described. First, a manufacturing method of the transistor 160 in the lower portion will be described below with reference to FIGS. 2A to 2D and FIGS. 3A to 3D, and then a manufacturing method of the transistor 162 in the upper portion and the capacitor 164 will be described with reference to FIGS. 4A to 4C and FIGS. 5A to 5C.

<Method for Manufacturing Transistor in Lower Portion>

Figure 2A:
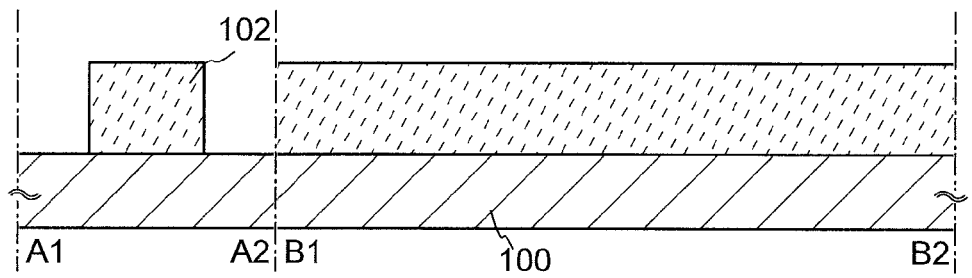
FIGS. 2A to 2D are cross-sectional views illustrating a manufacturing process of a semiconductor device.
Figure 2B:
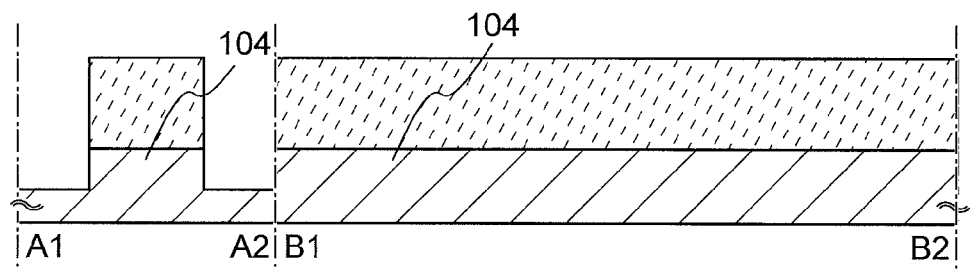

First, the substrate 100 including a semiconductor material is prepared (see FIG. 2A). As the substrate 100 including a semiconductor material, a single crystal semiconductor substrate or a polycrystalline semiconductor substrate made of silicon, silicon carbide, or the like; a compound semiconductor substrate made of silicon germanium or the like; an SOI substrate; or the like can be used. Here, an example of using a single crystal silicon substrate as the substrate 100 including a semiconductor material is described. Note that in general, the term "SOI substrate" means a substrate where a silicon semiconductor layer is provided on an insulating surface. In this specification and the like, the term "SOI substrate" also includes a substrate where a semiconductor layer formed using a material other than silicon is provided on an insulating surface in its category. That is, a semiconductor layer included in the "SOI substrate" is not limited to a silicon semiconductor layer. Moreover, the SOI substrate can also be a substrate having a structure in which a semiconductor layer is provided over an insulating substrate such as a glass substrate, with an insulating layer interposed therebetween.

It is preferable that a single crystal semiconductor substrate of silicon or the like be particularly used as the substrate 100 including a semiconductor material because the speed of reading operation of the semiconductor device can be increased.

A protective layer 102 serving as a mask for forming the element isolation insulating layer is formed over the substrate 100 (see FIG. 2A). As the protective layer 102, for example, an insulating layer formed using silicon oxide, silicon nitride, silicon oxynitride, or the like as a material can be used. Note that before or after this step, an impurity element imparting n-type conductivity or an impurity element imparting p-type conductivity may be added to the substrate 100 in order to control the threshold voltage of the transistor. In the case where silicon is used as the semiconductor, for example, phosphorus, arsenic, or the like can be used as an impurity element imparting n-type conductivity. On the other hand, for example, boron, aluminum, gallium, or the like can be used as an impurity element imparting p-type conductivity.

Next, part of the substrate 100 in a region that is not covered with the protective layer 102 (in an exposed region) is removed by etching with the use of the protective layer 102 as a mask. Thus, a semiconductor region 104 which is apart from another semiconductor region is formed (see FIG. 2B). As the etching, dry etching is preferably performed, but wet etching may be performed. An etching gas and an etchant can be selected as appropriate depending on a material of a layer to be etched.

Figure 2C:
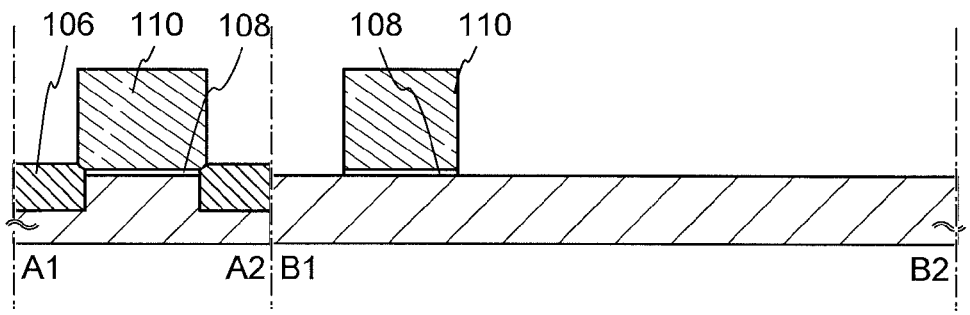

Next, an insulating layer is fin lied so as to cover the semiconductor region 104 and a region of the insulating layer which overlaps with the semiconductor region 104 is selectively removed, so that the element isolation insulating layer 106 is formed (see FIG. 2C). The insulating layer is formed using silicon oxide, silicon nitride, silicon oxynitride, or the like. For removing the insulating layer, any of etching treatment, polishing treatment such as chemical mechanical polishing (CMP), and the like can be employed. Note that the protective layer 102 is removed after the formation of the semiconductor region 104 or after the formation of the element isolation insulating layer 106.

Here, the CMP treatment is treatment of planarizing a surface of an object to be processed by a combination of chemical and mechanical actions using the surface as a reference. More specifically, the CMP treatment is a method in which a polishing cloth is attached to a polishing stage, the polishing stage and the object to be processed are each rotated or swung while a slurry (an abrasive) is supplied between the object to be processed and the polishing cloth, and the surface of the object to be processed is polished by chemical reaction between the slurry and the surface of the object to be processed and by action of mechanical polishing between the object to be processed and the polishing cloth.

Note that as a method for forming the element isolation insulating layer 106, a method in which an insulating region is formed by introduction of oxygen, or the like can be used in addition to the method in which the insulating layer is selective etched.

Next, an insulating layer is formed over the surface of the semiconductor region 104, and a layer including a conductive material is formed over the insulating layer.

The insulating layer is to be the gate insulating layer later and can be formed by performing heat treatment (e.g., thermal oxidation treatment or thermal nitridation treatment) on the surface of the semiconductor region 104, for example. Instead of heat treatment, high-density plasma treatment may be employed. The high-density plasma treatment can be performed using, for example, a mixed gas of a rare gas such as He, Ar, Kr, or Xe and any of oxygen, nitrogen oxide, ammonia, nitrogen, and hydrogen. Needless to say, the insulating layer may be formed using a CVD method, a sputtering method, or the like. The insulating layer preferably has a single layer structure or a layered structure using one or more of silicon oxide, silicon oxynitride, silicon nitride, hafnium oxide, aluminum oxide, tantalum oxide, yttrium oxide, hafnium silicate (HfSi$_x$O$_y$ (x>0 and y>0)), hafnium silicate to which nitrogen is added, hafnium aluminate to which nitrogen is added, and the like. The insulating layer can have a thickness of, for example, greater than or equal to 1 nm and less than or equal to 100 nm, preferably greater than or equal to 10 nm and less than or equal to 50 nm.

The layer including a conductive material can be formed using a metal material such as aluminum, copper, titanium, tantalum, or tungsten. The layer including a conductive material may be formed using a semiconductor material such as polycrystalline silicon, or such layers may be stacked. There is no particular limitation on the method for forming the layer including a conductive material, and any of a variety of film formation methods such as an evaporation method, a CVD method, a sputtering method, and a spin coating method can be employed. In this embodiment, for example, the layer including a conductive material has a structure in which three layers of a tantalum nitride layer, a tungsten layer, and a tantalum nitride layer are stacked in order from a layer in contact with the insulating layer.

After that, the insulating layer and the layer including a conductive material are selectively etched, so that the gate insulating layer 108 and the gate electrode 110 are formed (see FIG. 2C).

Figure 2D:
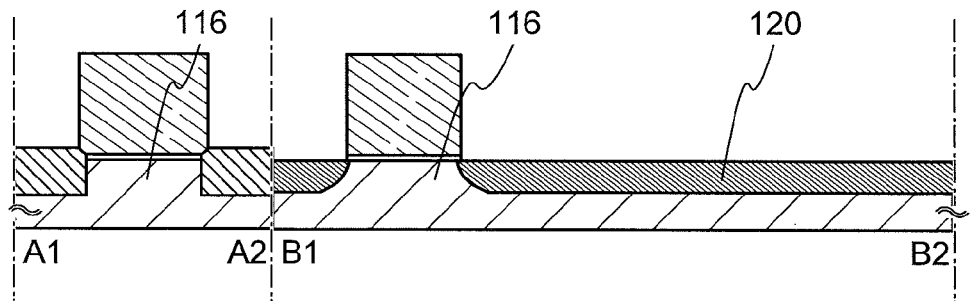

Next, phosphorus (P), arsenic (As), or the like is added to the semiconductor region 104, so that the channel formation region 116 and the impurity regions 120 are formed (see FIG. 2D). Note that phosphorus or arsenic is added here in order to form an n-channel transistor; an impurity element such as boron (B) or aluminum (Al) may be added in the case of forming a p-channel transistor. Here, the concentration of the added impurity can be set as appropriate; the concentration is preferably high when the size of a semiconductor element is extremely decreased.

Note that a sidewall insulating layer may be formed in the periphery of the gate electrode 110 so that an impurity region to which an impurity element is added at a different concentration may be formed.

Figure 3A:
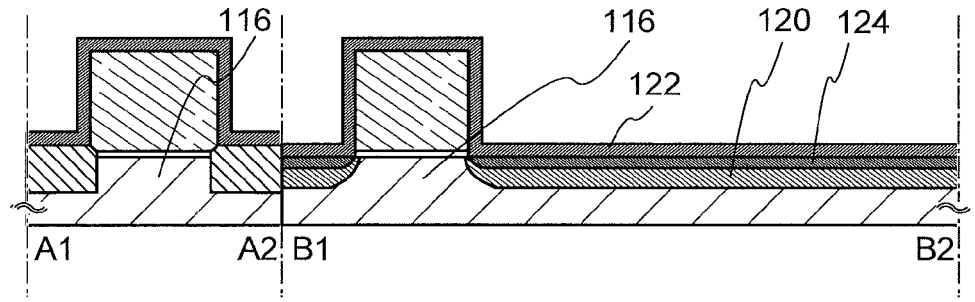
FIGS. 3A to 3D are cross-sectional views illustrating a manufacturing process of a semiconductor device.

Next, a metal layer 122 is formed so as to cover the gate electrode 110, the impurity regions 120, and the like (see FIG. 3A). Any of a variety of film formation methods such as a vacuum evaporation method, a sputtering method, and a spin coating method can be employed for forming the metal layer 122. The metal layer 122 is preferably formed using a metal material that reacts with a semiconductor material included in the semiconductor region 104 to be a low-resistance metal compound. Examples of such metal materials include titanium, tantalum, tungsten, nickel, cobalt, and platinum.

Next, heat treatment is performed so that the metal layer 122 reacts with the semiconductor material. Thus, the metal compound regions 124 that are in contact with the impurity regions 120 are formed (see FIG. 3A). Note that when the gate electrode 110 is formed using polycrystalline silicon or the like, a metal compound region is also fainted in a region of the gate electrode 110 in contact with the metal layer 122.

As the heat treatment, irradiation with a flash lamp can be employed, for example. Although it is needless to say that another heat treatment method may be used, a method by which heat treatment for an extremely short time can be achieved is preferably used in order to improve the controllability of chemical reaction in formation of the metal compound. Note that the metal compound regions are formed by reaction of the metal material and the semiconductor material and have sufficiently high conductivity. The formation of the metal compound regions can sufficiently reduce the electric resistance and improve element characteristics. Note that the metal layer 122 is removed after the metal compound regions 124 are formed.

Figure 3B:
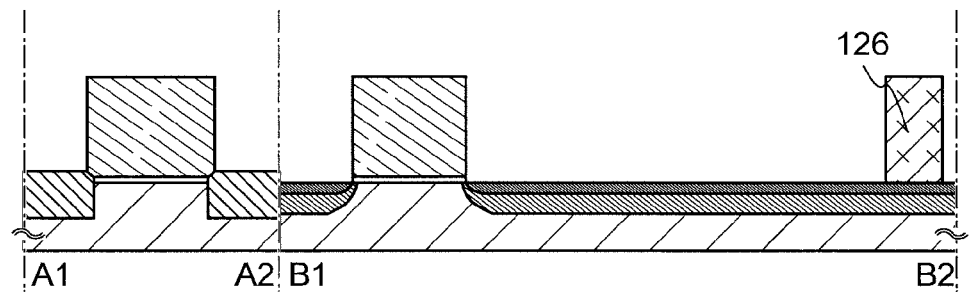

Next, the electrode 126 is formed in a region in contact with part of the metal compound region 124 (see FIG. 3B). The electrode 126 is formed by, for example, forming a layer including a conductive material and then selectively etching the layer. The layer including a conductive material can be formed using a metal material such as aluminum, copper, titanium, tantalum, or tungsten. The layer including a conductive material may be formed using a semiconductor material such as polycrystalline silicon. There is no particular limitation on the method for forming the layer including a conductive material, and any of a variety of film formation methods such as an evaporation method, a CVD method, a sputtering method, and a spin coating method can be employed.

Figure 3C:
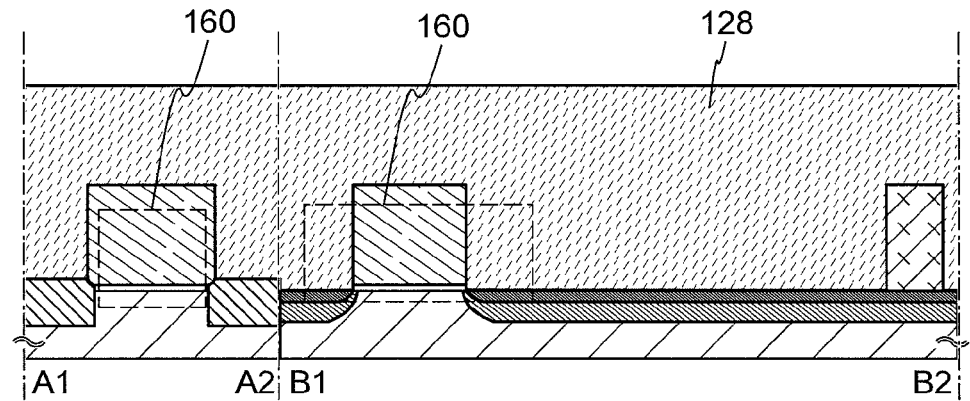

Then, the insulating layer 128 is formed to cover the components formed in the above steps (see FIG. 3C). The insulating layer 128 can be formed using a material including an inorganic insulating material such as silicon oxide, silicon oxynitride, silicon nitride, or aluminum oxide. In particular, a material with a low dielectric constant (a low-k material) is preferably used for the insulating layer 128, because capacitance due to overlap of electrodes or wirings can be sufficiently reduced. Note that the insulating layer 128 may be a porous insulating layer formed using any of those materials. Since the porous insulating layer has low dielectric constant as compared to a dense insulating layer, capacitance due to electrodes or wirings can be further reduced. Further, the insulating layer 128 can be formed using an organic insulating material such as polyimide or acrylic. Note that although the insulating layer 128 has a single layer structure here, an embodiment of the invention disclosed herein is not limited to this. The insulating layer 128 may have a layered structure including two or more layers.

Alternatively, the electrode 126 can be formed by forming an opening reaching the metal compound region 124 in the insulating layer 128 after the formation of the insulating layer 128 and then by filling the opening.

In that case, it is possible to use a method, for example, in which a thin titanium film is formed by a PVD method and a thin titanium nitride film is formed by a CVD method in a region including the opening, and then a tungsten film is formed so as to fill the opening. Here, the titanium film formed by a PVD method has a function of reducing an oxide film (such as a native oxide film) formed on a surface over which the titanium film is formed, thereby lowering the contact resistance with the lower electrode or the like (the metal compound region 124, here). The titanium nitride film formed after the formation of the titanium film has a barrier function of preventing diffusion of the conductive material. A copper film may be formed by a plating method after the formation of the barrier film of titanium, titanium nitride, or the like.

Through the above steps, the transistor 160 is manufactured with the use of the substrate 100 including a semiconductor material (see FIG. 3C). Such a transistor 160 is capable of high-speed operation. Thus, when the transistor is used as a reading transistor, data can be read at a high speed.

Figure 3D:
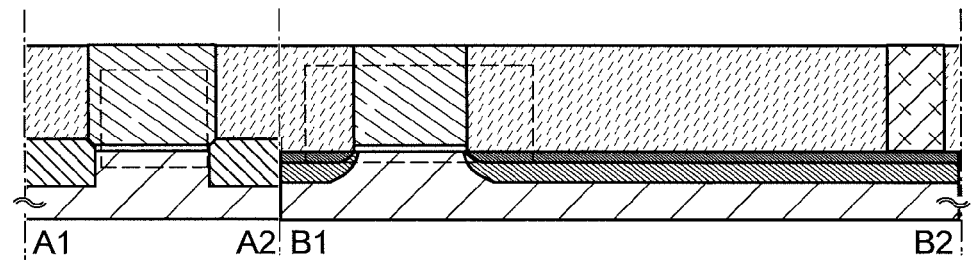

After that, as treatment before the formation of the transistor 162 and the capacitor 164, CMP treatment is performed on the insulating layer 128 to expose upper surfaces of the gate electrode 110 and the electrode 126 (see FIG. 3D). As treatment for exposing the upper surfaces of the gate electrode 110 and the electrode 126, as well as CMP treatment, etching treatment or the like can be employed; in order to improve characteristics of the transistor 162, the surface of the insulating layer 128 is preferably made as planar as possible.

Note that before or after the above steps, a step for forming an additional electrode, wiring, semiconductor layer, or insulating layer may be performed. For example, a multilayer wiring structure in which an insulating layer and a conductive layer are stacked is employed as a wiring structure, so that a highly integrated semiconductor device can be provided.

<Method for Manufacturing Transistor in Upper Portion>

Figure 4A:
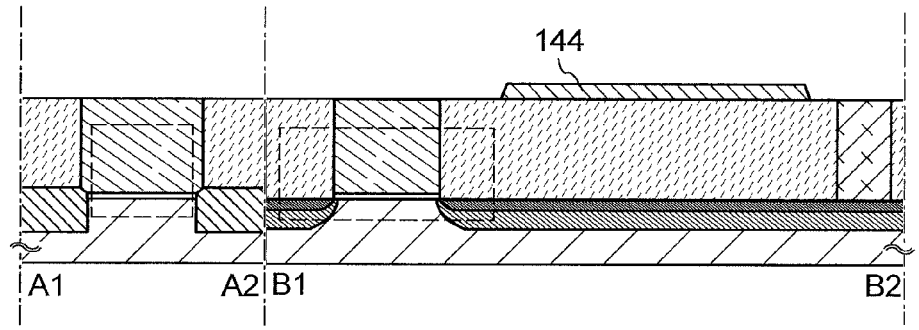
FIGS. 4A to 4C are cross-sectional views illustrating a manufacturing process of a semiconductor device.

An oxide semiconductor layer is formed over the gate electrode 110, the electrode 126, the insulating layer 128, and the like, and is selectively etched to form the oxide semiconductor layer 144 (see FIG. 4A). Note that an insulating layer serving as a base may be provided over the insulating layer 128. The insulating layer can be formed by a PVD method, a CVD method, or the like.

The oxide semiconductor layer can be formed using a four-component metal oxide such as an In—Sn—Ga—Zn—O-based oxide semiconductor, a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor, a two-component metal oxide such as an In—Zn—O-based oxide semiconductor, an In—Ga—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, or an In—Mg—O-based oxide semiconductor, an In—O-based oxide semiconductor, a Sn—O-based oxide semiconductor, or a Zn—O-based oxide semiconductor, or the like. In addition, any of the above oxide semiconductors may contain an element other than In, Ga, Sn, and Zn, for example, $SiO_2$.

For example, an In—Ga—Zn—O-based oxide semiconductor material can have sufficiently high resistance when there is no electric field and thus the off-state current can be sufficiently reduced. In addition, field-effect mobility is high, so that the In—Ga—Zn—O-based oxide semiconductor material is suitable for the semiconductor material used in the semiconductor device. Note that the In—Ga—Zn—O-based oxide semiconductor material means an oxide semiconductor material containing indium (In), gallium (Ga), and zinc (Zn), and there is no particular limitation on the composition ratio thereof.

For the oxide semiconductor layer, a thin film of a material expressed by a chemical formula of $InMO_3(ZnO)_m$ (m>0) can be used. Here, M represents one or more metal elements selected from Zn, Ga, Al, Mn, and Co. For example, M can be Ga, Ga and Al, Ga and Mn, Ga and Co, or the like. Note that the above-described compositions are derived from the crystal structures that the oxide semiconductor material can have and are only examples.

In addition, as a target used for forming the oxide semiconductor layer by a sputtering method, a target with a composition ratio of In:Ga:Zn=1:x:y (x is greater than or equal to 0, and y is greater than or equal to 0.5 and less than or equal to 5) is preferably used. For example, a target with a composition ratio of In:Ga:Zn=1:1:1 [atomic ratio] (x=1, y=1) (that is, $In_2O_3$:$Ga_2O_3$:ZnO=1:1:2 [molar ratio]) or the like can be used. In addition, a target with a composition ratio of In:Ga:Zn=1:1:0.5 [atomic ratio] (x=1, y=0.5), a target with a composition ratio of In:Ga:Zn=1:1:2 [atomic ratio] (x=1, y=2), or a target with a composition ratio of In:Ga:Zn=1:0:1 [atomic ratio] (x=0, y=1) can be used.

In the case where an In—Zn—O-based material is used as an oxide semiconductor, a target therefor has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), more preferably In:Zn=15:1 to 1.5:1 in an atomic ratio ($In_2O_3$:ZnO=15:2 to 3:4 in a molar ratio). For example, in a target used for formation of an In—Zn—O-based oxide semiconductor which has an atomic ratio of In:Zn:O=X:Y:Z, the relation of $Z>1.5X+Y$ is satisfied.

In this embodiment, an oxide semiconductor layer with an amorphous structure is formed by a sputtering method with the use of an In—Ga—Zn—O-based target.

The relative density of a metal oxide in the target is greater than or equal to 80%, preferably greater than or equal to 95%, more preferably greater than or equal to 99.9%. The use of a target with high relative density makes it possible to form an oxide semiconductor layer with a dense structure.

The atmosphere in which the oxide semiconductor layer is formed is preferably a rare gas (typically argon) atmosphere, an oxygen atmosphere, or a mixed atmosphere containing a rare gas (typically argon) and oxygen. Specifically, it is preferable to use, for example, an atmosphere of a high-purity gas from which an impurity such as hydrogen, water, a hydroxyl group, or hydride is removed so that the concentration is less than or equal to 1 ppm (preferably less than or equal to 10 ppb).

In forming the oxide semiconductor layer, an object to be processed is held in a treatment chamber that is maintained at reduced pressure and is heated so that the temperature of the object to be processed is greater than or equal to 100° C. and less than 550° C., preferably greater than or equal to 200° C. and less than or equal to 400° C. Alternatively, the temperature of the object to be processed in the formation of the oxide semiconductor layer may be room temperature (25° C.±10° C.). Then, a sputtering gas from which hydrogen, water, and the like are removed is introduced into the treatment chamber while moisture in the treatment chamber is removed, and the oxide semiconductor layer is formed using the above target. By forming the oxide semiconductor layer while heating the object to be processed, impurities in the oxide semiconductor layer can be reduced. Moreover, damage due to sputtering can be reduced. In order to remove moisture from the treatment chamber, an entrapment vacuum pump is preferably used. For example, a cryopump, an ion pump, a titanium sublimation pump, or the like can be used. A turbo pump provided with a cold trap may be used. By performing evacuation with the use of a cryopump or the like, hydrogen, water, and the like can be removed from the treatment chamber; thus, the impurity concentration in the oxide semiconductor layer can be reduced.

The oxide semiconductor layer can be formed under the following conditions, for example: the distance between the object to be processed and the target is 170 mm, the pressure is 0.4 Pa, the direct current (DC) power is 0.5 kW, and the atmosphere is an oxygen (oxygen: 100%) atmosphere, an argon (argon: 100%) atmosphere, or a mixed atmosphere containing oxygen and argon. Note that a pulsed direct current (DC) power source is preferably used because dust (such as powder substances generated in film formation) can be reduced and the film thickness can be uniform. The thickness of the oxide semiconductor layer is greater than or equal to 1 nm and less than or equal to 50 nm, preferably greater than or equal to 1 nm and less than or equal to 30 nm, more preferably greater than or equal to 1 nm and less than or equal to 10 nm. With the oxide semiconductor layer having such a thickness, a short-channel effect which occurs along with miniaturization can be suppressed. Note that an appropriate thickness differs depending on an oxide semiconductor material used, the usage of the semiconductor device, or the like; therefore, it is also possible to set the thickness depending on the material to be used, the usage, or the like.

Note that before the oxide semiconductor layer is formed by a sputtering method, reverse sputtering in which plasma is generated with an argon gas introduced is preferably performed, so that substances attached to a surface on which the oxide semiconductor layer is to be formed (e.g., a surface of the insulating layer 128) are removed. Here, reverse sputtering refers to a method in which ions collide with a surface of the substrate to be processed in order to modify the surface, in contrast to normal sputtering which refers to a method in which ions collide with a sputtering target. An example of a method for making ions collide with a surface to be processed is a method in which high-frequency voltage is applied to the surface to be processed in an argon atmosphere so that plasma is generated in the vicinity of the object to be processed. Note that an atmosphere of nitrogen, helium, oxygen, or the like may be used instead of an argon atmosphere.

After that, heat treatment (first heat treatment) is preferably performed on the oxide semiconductor layer. Excessive hydrogen (including water and a hydroxyl group) in the oxide semiconductor layer can be removed by the first heat treatment. The temperature of the first heat treatment is, for example, greater than or equal to 300° C. and less than 550° C., or greater than or equal to 400° C. and less than or equal to 500° C.

The heat treatment can be performed in such a way that, for example, an object to be processed is introduced into an electric furnace in which a resistance heating element or the like is used and heated in a nitrogen atmosphere at 450° C. for an hour. During the heat treatment, the oxide semiconductor layer is not exposed to the air to prevent the entry of water and hydrogen.

The heat treatment apparatus is not limited to the electric furnace and may be an apparatus for heating an object to be processed by thermal radiation or thermal conduction from a medium such as a heated gas. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object to be processed by heat treatment, such as nitrogen or a rare gas such as argon is used.

For example, as the first heat treatment, GRTA treatment may be performed as follows. The object to be processed is put in an inert gas atmosphere that has been heated, heated for several minutes, and taken out of the inert gas atmosphere. The GRTA treatment enables high-temperature heat treatment for a short time. Moreover, the GRTA treatment can be employed even when the temperature exceeds the upper temperature limit of the object to be processed. Note that the inert gas may be switched to a gas containing oxygen during the process. This is because defect levels in the energy gap due to oxygen deficiency can be reduced by performing the first heat treatment in an atmosphere containing oxygen.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into the heat treatment apparatus is greater than or equal to 6N (99.9999%), preferably greater than or equal to 7N (99.99999%) (that is, the concentration of the impurities is less than or equal to 1 ppm, preferably less than or equal to 0.1 ppm).

The above heat treatment (first heat treatment) can be referred to as dehydration treatment, dehydrogenation treatment, or the like because of its effect of removing hydrogen, water, and the like. The dehydration treatment or dehydrogenation treatment can be performed, for example, after the oxide semiconductor layer is formed, after the gate insulating layer is formed, or after the gate electrode is formed. Such dehydration treatment or dehydrogenation treatment may be conducted once or plural times.

The oxide semiconductor layer may be etched either before or after the heat treatment. In view of miniaturization of elements, dry etching is preferably used; however, wet etching may be used. An etching gas and an etchant can be selected as appropriate depending on a material of a layer to be etched.

Figure 4B:
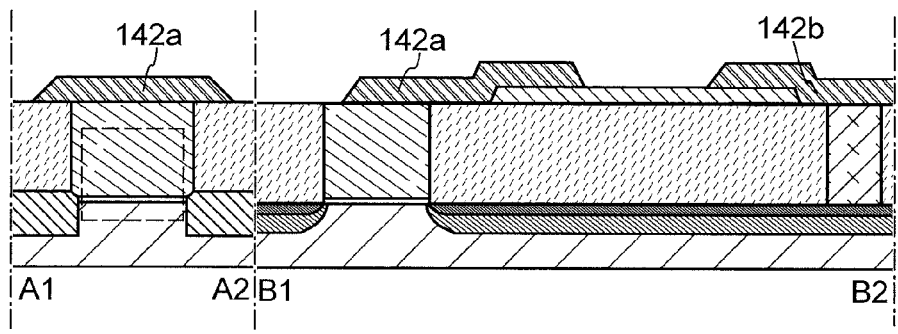
Figure 4C:
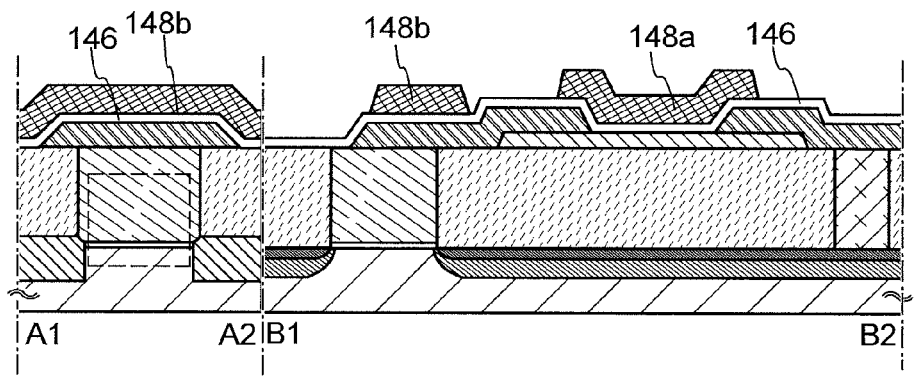

Then, a conductive layer is formed over the gate electrode 110, the electrode 126, the insulating layer 128, the oxide semiconductor layer 144, and the like and is selectively etched, whereby the source electrode 142a and the drain electrode 142b are formed (see FIG. 4B).

The conductive layer can be formed by a PVD method such as a sputtering method, or a CVD method such as a plasma CVD method. As a material of the conductive layer, an element selected from aluminum, chromium, copper, tantalum, titanium, molybdenum, and tungsten, an alloy containing any of these elements as its component, or the like, having etching selectivity with respect to the gate electrode 110, can be used. In addition, any of manganese, magnesium, zirconium, beryllium, neodymium, and scandium, or a material containing two or more of these in combination may be used as long as such a material can have etching selectivity with respect to the gate electrode 110. Note that the etching selectivity of the conductive layer for forming the source electrode 142a and the drain electrode 142b with respect to the gate electrode 110 is preferably greater than or equal to 2, more preferably greater than or equal to 3.

The conductive layer can have a single-layer structure or a layered structure including two or more layers. When the conductive layer has a layered structure, at least a layer in contact with the gate electrode 110 may have etching selectivity with respect to the gate electrode 110 (an uppermost surface layer thereof when the gate electrode 110 has a layered structure). In this embodiment, for example, a tungsten layer is used as the conductive layer for forming the source electrode 142a and the drain electrode 142b.

The conductive layer may be formed using a conductive metal oxide as long as it has etching selectivity with respect to the gate electrode 110. As the conductive metal oxide, indium oxide ($In_2O_3$), tin oxide ($SnO_2$), zinc oxide (ZnO), an indium oxide-tin oxide alloy ($In_2O_3$—$SnO_2$, which is abbreviated to ITO in some cases), an indium oxide-zinc oxide alloy ($In_2O_3$—ZnO), or any of these metal oxide materials in which silicon or silicon oxide is contained can be used.

The conductive layer is preferably etched such that the source electrode 142a and the drain electrode 142b are formed to have tapered end portions. Here, a taper angle is, for example, preferably greater than or equal to 30° and less than or equal to 60°. The etching is performed so that the end portions of the source electrode 142a and the drain electrode 142b are tapered, whereby coverage with the gate insulating layer 146 formed later can be improved and breaking thereof can be prevented.

The channel length (L) of the transistor in the upper portion is determined by the distance between the lower end portion of the source electrode 142a and the lower end portion of the drain electrode 142b. Note that for light exposure for forming a mask used in the case where a transistor with a channel length (L) of less than 25 nm is formed, it is preferable to use extreme ultraviolet light whose wavelength is as short as several nanometers to several tens of nanometers. In the light exposure by extreme ultraviolet light, the resolution is high and the focus depth is large. Thus, the channel length (L) of the transistor formed later can be reduced, whereby the operation speed of a circuit can be increased. Moreover, reduction in the channel length can lead to low power consumption of the semiconductor device.

Here, the conductive layer for forming the source electrode 142a and the drain electrode 142b is formed using a material having etching selectivity with respect to the gate electrode 110. In this embodiment, for example, a tungsten layer is used as the conductive layer for forming the source electrode 142a and the drain electrode 142b, and a tantalum nitride layer is used for a layer in the gate electrode 110 which is in contact with the conductive layer; thus, the etching selectivity of the conductive layer for forming the source electrode 142a and the drain electrode 142b with respect to the gate electrode 110 is greater than or equal to 2. Accordingly, even when a pattern is misaligned in formation of the source electrode 142a and the drain electrode 142b, the gate electrode 110 can be prevented from being etched, whereby it is not necessary to design the layout in consideration of a margin of the source electrode 142a for overlapping with the gate electrode 110, and the degree of integration can be increased.

Next, the gate insulating layer 146 which covers the source electrode 142a, the drain electrode 142b, and the oxide semiconductor layer 144 is formed. After that, over the gate insulating layer 146, the gate electrode 148a is formed in a region overlapping with the oxide semiconductor layer 144, and the electrode 148b is formed in a region overlapping with the source electrode 142a (see FIG. 4C).

The gate insulating layer 146 can be formed by a CVD method, a sputtering method, or the like. The gate insulating layer 146 is preferably formed so as to contain silicon oxide, silicon nitride, silicon oxynitride, aluminum oxide, tantalum oxide, hafnium oxide, yttrium oxide, hafnium silicate (Hf-$Si_xO_y$ (x>0, y>0)), hafnium silicate to which nitrogen is added, hafnium aluminate to which nitrogen is added, gallium oxide, or the like. The gate insulating layer 146 may have a single-layer structure or a layered structure. There is no particular limitation on the thickness; however, in the case where the semiconductor device is miniaturized, the thickness is preferably small for ensuring operation of the transistor. For example, in the case where silicon oxide is used, the thickness can be set to greater than or equal to 1 nm and less than or equal to 100 nm, preferably greater than or equal to 10 nm and less than or equal to 50 nm.

When the gate insulating layer is thin as in the above description, a problem of gate leakage due to a tunnel effect or the like is caused. In order to solve the problem of gate leakage, the gate insulating layer 146 may be formed using a high dielectric constant (high-k) material such as hafnium oxide, tantalum oxide, yttrium oxide, hafnium silicate, hafnium silicate to which nitrogen is added, or hafnium aluminate to which nitrogen is added. By using a high-k material for the gate insulating layer 146, electric characteristics can be ensured and the thickness can be large to prevent gate leakage. Note that a layered structure of a film containing a high-k material and a film containing any one of silicon oxide, silicon nitride, silicon oxynitride, silicon nitride oxide, aluminum oxide, and the like may be employed.

After the gate insulating layer 146 is formed, second heat treatment is desirably performed in an inert gas atmosphere or an oxygen atmosphere. The temperature of the heat treatment is set to greater than or equal to 200° C. and less than or equal to 450° C., preferably greater than or equal to 250° C. and less than or equal to 350° C. For example, the heat treatment may be performed at 250° C. for 1 hour in a nitrogen atmosphere. The second heat treatment can reduce variation in electric characteristics of the transistor. Further, in the case where the gate insulating layer 146 contains oxygen, oxygen is supplied to the oxide semiconductor layer 144 which has been subjected to the dehydration treatment or dehydrogenation treatment to compensate for oxygen deficiency in the oxide semiconductor layer 144, so that an i-type (intrinsic) or substantially i-type oxide semiconductor layer can be formed.

Note that in this embodiment, the second heat treatment is performed after the gate insulating layer 146 is formed; the timing of the second heat treatment is not limited thereto. For example, the second heat treatment may be performed after the gate electrode is formed.

As described above, the first heat treatment and the second heat treatment are applied, whereby the oxide semiconductor layer 144 can be highly purified so as to minimize the amount of impurities that are not main components of the oxide semiconductor.

The gate electrode 148a and the electrode 148b can be formed in such a manner that a conductive layer is formed over the gate insulating layer 146 and then etched selectively. The conductive layer for forming the gate electrode 148a and the electrode 148b can be formed by a PVD method such as a sputtering method or a CVD method such as a plasma CVD method. The details are similar to those of the source electrode 142a and the drain electrode 142b; thus, description thereof can be referred to.

The electrode 148b, which serves as an electrode of the capacitor, is preferably formed to overlap with at least part of the gate electrode 110 of the transistor 160. This is because by employing such a structure, the area of the circuit can be sufficiently reduced.

Figure 5A:
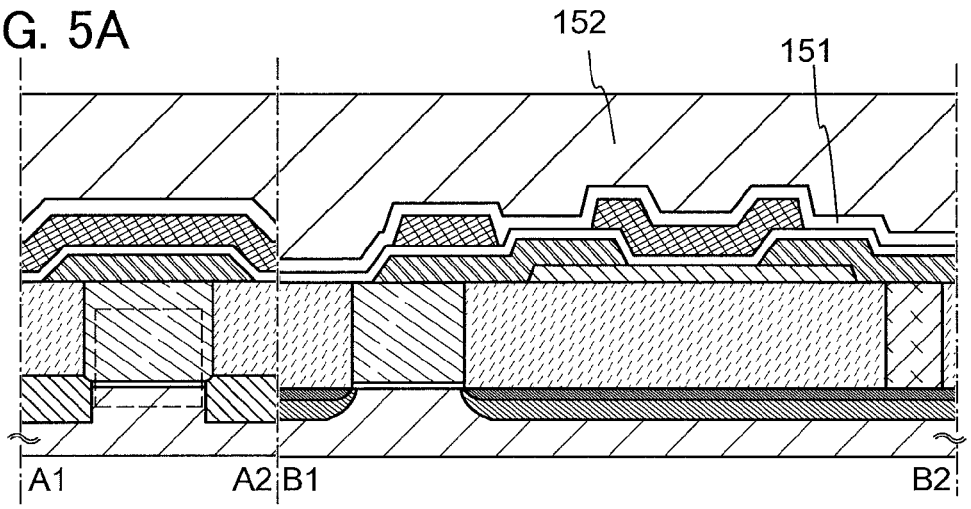
FIGS. 5A to 5C are cross-sectional views illustrating a manufacturing process of a semiconductor device.

Next, the insulating layer 151 and the insulating layer 152 are formed over the gate insulating layer 146, the gate electrode 148a, and the electrode 148b (see FIG. 5A). The insulating layer 151 and the insulating layer 152 can be formed by a PVD method, a CVD method, or the like. The insulating layer 151 and the insulating layer 152 can be formed using a material including an inorganic insulating material such as silicon oxide, silicon oxynitride, silicon nitride, hafnium oxide, aluminum oxide, or gallium oxide.

Note that for the insulating layer 151 and the insulating layer 152, a material with a low dielectric constant is preferably used or a structure with a low dielectric constant (e.g., a porous structure) is preferably employed. This is because when the insulating layer 151 and the insulating layer 152 have a low dielectric constant, capacitance generated between wirings, electrodes, or the like can be reduced and operation at higher speed can be achieved.

Note that although a layered structure of the insulating layer 151 and the insulating layer 152 is used in this embodiment, an embodiment of the present invention is not limited thereto. The insulating layer over the transistor 162 and the capacitor 164 may have a single-layer structure or a layered structure including three or more layers. Alternatively, the insulating layer may be omitted.

Note that the insulating layer 152 is preferably formed so as to have a planar surface. By forming the insulating layer 152 so as to have a planar surface, an electrode, a wiring, or the like can be favorably formed over the insulating layer 152 even in the case where the semiconductor device is miniaturized, for example. Note that the insulating layer 152 can be planarized by a method such as CMP treatment.

Figure 5B:
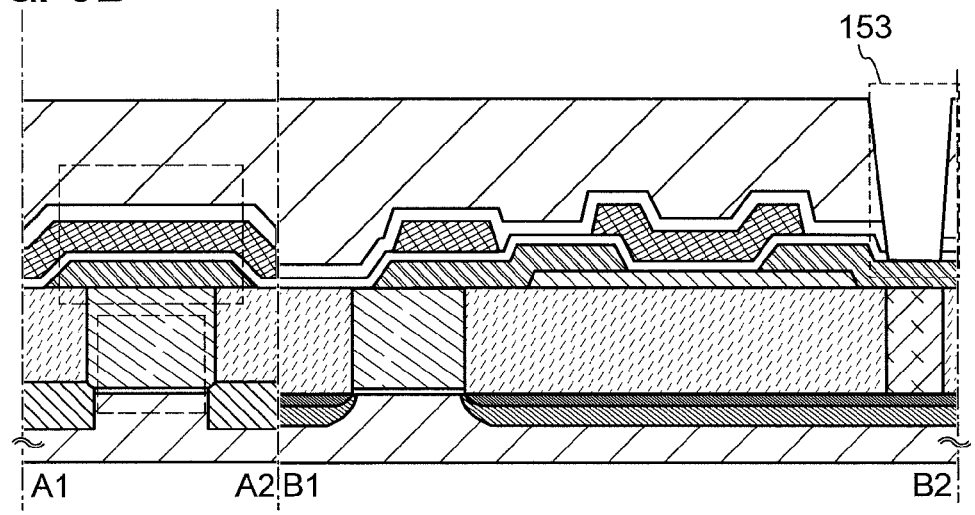

Then, an opening 153 reaching the drain electrode 142b is formed in the gate insulating layer 146, the insulating layer 151, and the insulating layer 152 (see FIG. 5B). The opening 153 is formed by selective etching using a mask or the like.

Here, the opening 153 is preferably formed in a region overlapping with the electrode 126. By forming the opening 153 in this region, the element area can be prevented from increasing due to a contact region of the electrodes. In other words, the degree of integration of the semiconductor device can be increased.

Figure 5C:
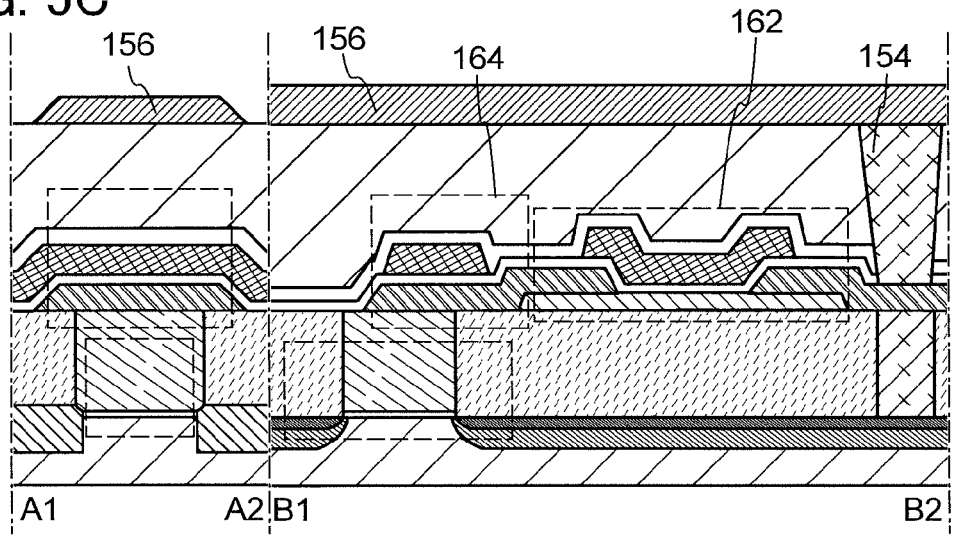

Then, the electrode 154 is formed in the opening 153 and the wiring 156 in contact with the electrode 154 is formed over the insulating layer 152 (see FIG. 5C).

The electrode 154 can be formed in such a manner that, for example, a conductive layer is formed by a PVD method, a CVD method, or the like in a region including the opening 153 and then part of the conductive layer is removed by etching treatment, CMP treatment, or the like.

Specifically, it is possible to employ a method, for example, in which a thin titanium film is formed by a PVD method and a thin titanium nitride film is formed by a CVD method in a region including the opening 153, and then a tungsten film is formed so as to fill the opening 153. Here, the titanium film formed by a PVD method has a function of reducing an oxide film (such as a native oxide film) over a surface where the titanium film is to be formed, thereby lowering contact resistance with the lower electrode or the like (the drain electrode 142b, here). The titanium nitride film formed after the formation of the titanium film has a barrier function of preventing diffusion of the conductive material. A copper film may be formed by a plating method after the formation of the barrier film of titanium, titanium nitride, or the like.

Note that in the case where the electrode 154 is formed by removing part of the conductive layer, processing is preferably performed so that the surface is planarized. For example, when a thin titanium film or a thin titanium nitride film is formed in a region including the opening 153 and then a tungsten film is formed so as to fill the opening 153, excess tungsten, titanium, titanium nitride, or the like can be removed and the planarity of the surface can be improved by subsequent CMP treatment. The surface including the electrode 154 is planarized in such a manner, whereby a favorable electrode, wiring, insulating layer, semiconductor layer, and the like can be formed in later steps.

The wiring 156 can be formed by forming a conductive layer by a PVD method such as a sputtering method, or a CVD method such as a plasma CVD method, and by patterning the conductive layer. As a material for the conductive layer, an element selected from aluminum, chromium, copper, tantalum, titanium, molybdenum, and tungsten; an alloy containing any of these elements as its component; or the like can be used. Further, one or more materials selected from manganese, magnesium, zirconium, beryllium, neodymium, and scandium may be used. The details are similar to those of the source electrode 142a or the drain electrode 142b, and the like.

Through the above steps, the capacitor 164 and the transistor 162 including the highly purified oxide semiconductor layer 144 is completed (see FIG. 5C).

Since the oxide semiconductor layer 144 is highly purified in the transistor 162 described in this embodiment, the hydrogen concentration is less than or equal to $5\times10^{19}$ atoms/cm$^3$, preferably less than or equal to $5\times10^{18}$ atoms/cm$^3$, more preferably less than or equal to $5\times10^{17}$ atoms/cm$^3$. In addition, the value of the carrier density of the oxide semiconductor layer 144 is sufficiently low (e.g., less than $1\times10^{12}$/cm$^3$, preferably less than $1.45\times10^{10}$/cm$^3$) in comparison with that of a general silicon wafer (approximately $1\times10^{14}$/cm$^3$). As a result of this, a sufficiently small off-state current can be obtained.

With the use of the oxide semiconductor layer 144 which is highly purified and becomes intrinsic, the off-state current of the transistor can be sufficiently reduced. Then, by using such a transistor, a semiconductor device in which stored data can be held for an extremely long time can be obtained.

Further, an oxide semiconductor has a wide energy gap of 3.0 eV to 3.5 eV and a very small number of thermally excited carriers. Therefore, characteristics of the transistor 162 including an oxide semiconductor do not deteriorate and an off-state current can be kept extremely small even at high temperatures.

In addition, in the semiconductor device described in this embodiment, the source electrode 142a of the transistor 162 in the upper portion which is provided on and in contact with the gate electrode 110 of the transistor 160 in the lower portion is formed using a material having etching selectivity with respect to the gate electrode 110. Therefore, when a pattern of the source electrode 142a is formed, the gate electrode 110 is not etched, and it is not necessary to provide a margin of the source electrode 142a for covering the gate electrode 110 in consideration of misalignment of a pattern of the source electrode 142a, whereby the layout area can be reduced. Accordingly, a semiconductor device with an increased degree of integration can be provided.

The structures, methods and the like described in this embodiment can be combined as appropriate with any of the structures, methods, and the like described in other embodiments.

Embodiment 2

In this embodiment, a structure of a semiconductor device according to another embodiment of the invention disclosed herein and a method for manufacturing the semiconductor device will be described with reference to FIGS. 6A and 6B, FIGS. 7A to 7H, FIGS. 8A to 8E, FIGS. 9A to 9C, and FIGS. 10A to 10C.

<Cross-Sectional Structure and Planar Structure of Semiconductor Device>

Figure 6A:
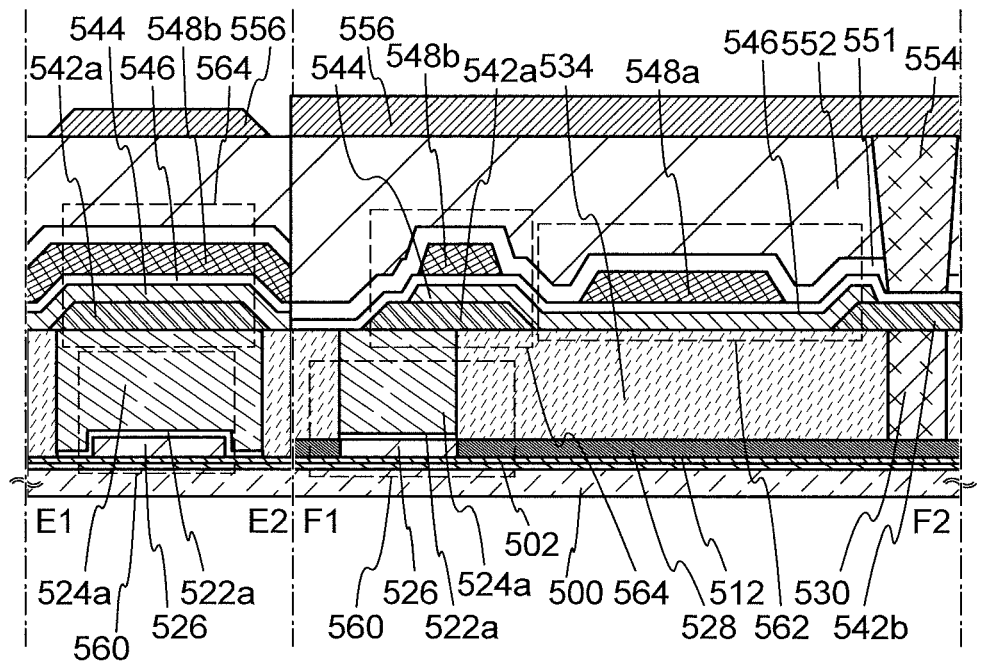
FIGS. 6A and 6B are a cross-sectional view and a plan view of a semiconductor device.
Figure 6B:
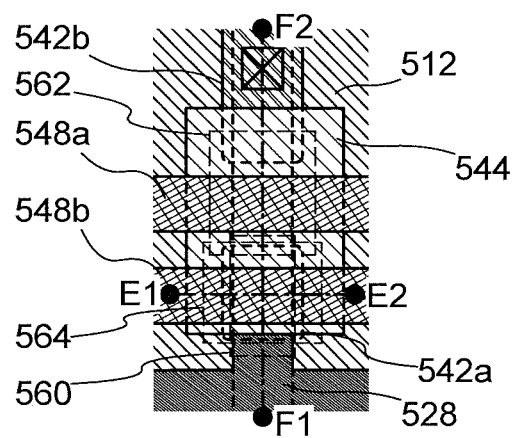

FIGS. 6A and 6B illustrate an example of a structure of a semiconductor device according to this embodiment. FIG. 6A is a cross-sectional view of the semiconductor device, and FIG. 6B is a plan view of the semiconductor device. Here, FIG. 6A illustrates a cross section taken along line E1-E2 and line F1-F2 in FIG. 6B. The semiconductor device illustrated in FIGS. 6A and 6B includes a transistor 560 including a first semiconductor material in a lower portion and a transistor 562 including a second semiconductor material in an upper portion. Here, the first semiconductor material is preferably different from the second semiconductor material. For example, the first semiconductor material can be a material (silicon) other than an oxide semiconductor and the second semiconductor material can be an oxide semiconductor. A transistor including a semiconductor material (e.g., single crystal silicon) other than an oxide semiconductor can easily operate at high speed. On the other hand, a transistor including an oxide semiconductor can hold charge for a long time owing to its characteristics.

Although all the transistors are n-channel transistors here, it is needless to say that p-channel transistors can be used. The technical feature of the invention disclosed herein lies in the use of a material with which off-state current can be sufficiently reduced, such as an oxide semiconductor, in the transistor 562 in order to hold data. Therefore, it is not necessary to limit specific conditions, such as a material, a structure, or the like of the semiconductor device, to those given here.

The transistor 560 illustrated in FIGS. 6A and 6B includes a channel formation region 526 provided in a semiconductor layer over a base substrate 500, impurity regions 528 with the channel formation region 526 provided therebetween; a gate insulating layer 522a provided over the channel formation region 526, and a gate electrode 524a provided over the gate insulating layer 522a. In other words, one of the differences between the transistor 560 in FIGS. 6A and 6B and the transistor 160 in FIGS. 1A and 1B is whether or not the channel formation region is formed in the semiconductor layer. It can also be said that the difference lies in the use of a semiconductor substrate or an SOI substrate. Note that a transistor whose source electrode and drain electrode are not illustrated in a drawing may also be referred to as a transistor for the sake of convenience.

An electrode 530 is connected to part of the impurity region 528 of the transistor 560. Here, the electrode 530 functions as a source electrode or a drain electrode of the transistor 560. An insulating layer 534 is provided to cover the transistor 560. Note that it is preferable that the transistor 560 do not include sidewall insulating layers as illustrated in FIGS. 6A and 6B in order to increase the degree of integration. On the other hand, in the case where characteristics of the transistor 560 are emphasized, a sidewall insulating layer may be provided on a side surface of the gate electrode 524a and the impurity region 528 may include a region having a different impurity concentration.

Further, a capacitor 564 in FIGS. 6A and 6B is similar to the capacitor 164 in FIGS. 1A and 1B. In other words, the capacitor 564 in FIGS. 6A and 6B includes a source electrode 542a, an oxide semiconductor layer 544, a gate insulating layer 546, and an electrode 548b. The source electrode 542a functions as one electrode of the capacitor 564, and the electrode 548b functions as the other electrode of the capacitor 564. The above embodiment can also be referred to for the other details.

One of the differences between the transistor 562 in FIGS. 6A and 6B and the transistor 162 in FIGS. 1A and 1B is the stacking order of the source electrode 542a and the drain electrode 542b and the oxide semiconductor layer 544. That is, the transistor 562 illustrated in FIGS. 6A and 6B includes the source electrode 542a and the drain electrode 542b, the oxide semiconductor layer 544 over the source electrode 542a and the drain electrode 542b, the gate insulating layer 546 covering the source electrode 542a, the drain electrode 542b, and the oxide semiconductor layer 544, and a gate electrode 548a provided over the gate insulating layer 546 so as to overlap with part of the oxide semiconductor layer 544.

The oxide semiconductor layer 544 includes a channel formation region which overlaps with the gate electrode 548a and an offset region which is in contact with the channel formation region, which is a difference between the transistor 562 in FIGS. 6A and 6B and the transistor 162 in FIGS. 1A and 1B. In the oxide semiconductor layer 544, the offset region is a region which does not overlap with the source electrode 542a, the drain electrode 542b, and the gate electrode 548a.

Note that the oxide semiconductor layer 544 is preferably highly purified by sufficiently removing impurities such as hydrogen or sufficiently supplying oxygen.

As in the semiconductor device in FIGS. 1A and 1B, in the semiconductor device in FIGS. 6A and 6B, an insulating layer 551 is provided over the transistor 562 and the capacitor 564, and an insulating layer 552 is provided over the insulating layer 551. An electrode 554 is provided in an opening formed in the gate insulating layer 546, the insulating layer 551, the insulating layer 552, and the like; and a wiring 556 connected to the electrode 554 is provided over the insulating layer 552. The wiring 556 electrically connects one memory cell to another memory cell. Note that although the impurity region 528, the drain electrode 542b, and the wiring 556 are connected to each other through the electrode 530 and the electrode 554 in FIGS. 6A and 6B, the invention disclosed herein is not limited thereto.

Note that in FIGS. 6A and 6B, the electrode 530 for connecting the impurity region 528 to the drain electrode 542b and the electrode 554 for connecting the drain electrode 542b to the wiring 556 overlap with each other. In other words, a region where the electrode 530 serving as a source or drain electrode of the transistor 560 and the drain electrode 542b of the transistor 562 are in contact with each other overlaps with a region where the drain electrode 542b of the transistor 562 and the electrode 554 are in contact with each other. Such a layout allows an increase in the degree of integration.

<Method for Manufacturing SOI Substrate>

Next, an example of a method for manufacturing an SOI substrate used for manufacturing the above-described semiconductor device will be described with reference to FIGS. 7A to 7H.

First, the base substrate 500 is prepared (see FIG. 7A). As the base substrate 500, a substrate formed using an insulator can be used. Specific examples thereof are as follows: a variety of glass substrates used in the electronics industry, such as substrates of aluminosilicate glass, aluminoborosilicate glass, and barium borosilicate glass; a quartz substrate; a ceramic substrate; and a sapphire substrate. Further, a ceramic substrate which contains silicon nitride and aluminum oxide as its main components and whose coefficient of thermal expansion is close to that of silicon may be used.

Alternatively, a semiconductor substrate such as a single crystal silicon substrate or a single crystal germanium substrate may be used as the base substrate 500. In the case where a semiconductor substrate is used as the base substrate 500, an SOI substrate with high quality can be easily obtained because the temperature condition for heat treatment is eased as compared to the case where a glass substrate or the like is used. Here, as a semiconductor substrate, a solar grade silicon (SOG-Si) substrate or the like may be used. Alternatively, a polycrystalline semiconductor substrate may be used. In the case of using a SOG-Si substrate, a polycrystalline semiconductor substrate, or the like, manufacturing cost can be reduced as compared to the case of using a single crystal silicon substrate or the like.

Note that in this embodiment, description is given of the case where a glass substrate is used as the base substrate 500. Cost reduction can be achieved when a glass substrate which can have a larger size and is inexpensive is used as the base substrate 500.

A surface of the base substrate 500 is preferably cleaned in advance. Specifically, the base substrate 500 is subjected to ultrasonic cleaning with a hydrochloric acid/hydrogen peroxide mixture (HPM), a sulfuric acid/hydrogen peroxide mixture (SPM), an ammonium hydrogen peroxide mixture (APM), diluted hydrofluoric acid (DHF), FPM (a mixed solution of hydrofluoric acid, hydrogen peroxide, and pure water), or the like. Through such cleaning treatment, the surface planarity of the base substrate 500 can be improved and abrasive particles left on the surface of the base substrate 500 can be removed.

Next, a nitrogen-containing layer 502 (e.g., a layer including an insulating film containing nitrogen, such as a silicon nitride ($SiN_x$) film or a silicon nitride oxide ($SiN_xO_y$ (x>y)) film) is formed over the surface of the base substrate 500 (see FIG. 7B). The nitrogen-containing layer 502 can be formed by a CVD method, a sputtering method, or the like.

The nitrogen-containing layer 502 formed in this embodiment corresponds to a layer for bonding a single crystal semiconductor layer (a bonding layer). The nitrogen-containing layer 502 also functions as a barrier layer for preventing an impurity contained in the base substrate, such as sodium (Na), from diffusing into the single crystal semiconductor layer.

As described above, since the nitrogen-containing layer 502 is used as the bonding layer in this embodiment, it is preferable that the nitrogen-containing layer 502 be formed to have a certain level of surface planarity. Specifically, the nitrogen-containing layer 502 is formed such that it has an average surface roughness ($R_a$, which is also referred to as arithmetic mean deviation) of less than or equal to 0.5 nm and a root-mean-square surface roughness (RMS) of less than or equal to 0.60 nm, preferably an average surface roughness of less than or equal to 0.35 nm and a root-mean-square surface roughness of less than or equal to 0.45 nm. Note that for the above average surface roughness or the root-mean-square surface roughness, for example, a value obtained by the measurement performed on a region of 10 μm×10 μm can be used. The thickness is set to greater than or equal to 10 nm and less than or equal to 200 nm, preferably greater than or equal to 50 nm and less than or equal to 100 nm. With the surface planarity improved as described above, the bonding defect of the single crystal semiconductor layer can be prevented.

Next, a bond substrate is prepared. Here, a single crystal semiconductor substrate 510 is used as the bond substrate (see FIG. 7C). Note that although a substrate whose crystallinity is single crystal is used as the bond substrate here, the crystallinity of the bond substrate is not necessarily limited to single crystal.

For example, as the single crystal semiconductor substrate 510, a single crystal semiconductor substrate formed using an element of Group 14, such as a single crystal silicon substrate, a single crystal germanium substrate, or a single crystal silicon germanium substrate, can be used. Further, a compound semiconductor substrate using gallium arsenide, indium phosphide, or the like can be used. Typical examples of commercially available silicon substrates are circular silicon substrates which are 5 inches (125 mm) in diameter, 6 inches (150 mm) in diameter, 8 inches (200 mm) in diameter, 12 inches (300 mm) in diameter, and 16 inches (400 mm) in diameter. Note that the shape of the single crystal semiconductor substrate 510 is not limited to circular, and the single crystal semiconductor substrate 510 may be a substrate which has been processed into, for example, a rectangular shape or the like. Further, the single crystal semiconductor substrate 510 can be formed by a Czochralski (CZ) method or a Floating Zone (FZ) method.

An oxide film 512 is formed on a surface of the single crystal semiconductor substrate 510 (see FIG. 7D). In view of removal of contamination, it is preferable that the surface of the single crystal semiconductor substrate 510 be cleaned with a hydrochloric acid/hydrogen peroxide mixture (RPM), a sulfuric acid/hydrogen peroxide mixture (SPM), an ammonium hydrogen peroxide mixture (APM), diluted hydrofluoric acid (DHF), FPM (a mixed solution of hydrofluoric acid, hydrogen peroxide, and pure water), or the like before the formation of the oxide film 512. Dilute hydrofluoric acid and ozone water may be discharged alternately for cleaning.

The oxide film 512 can be formed with, for example, a single layer structure or a layered structure of one or more of a silicon oxide film, a silicon oxynitride film, and the like. As a method for forming the oxide film 512, a thermal oxidation method, a CVD method, a sputtering method, or the like can be used. When the oxide film 512 is formed by a CVD method, a silicon oxide film is preferably formed using organosilane such as tetraethoxysilane (abbreviation: TEOS) (chemical formula: $Si(OC_2H_5)_4$), so that favorable bonding can be achieved.

In this embodiment, the oxide film 512 (here, a $SiO_x$ film) is formed by performing thermal oxidation treatment on the single crystal semiconductor substrate 510. The thermal oxidation treatment is preferably performed in an oxidizing atmosphere to which halogen is added.

For example, thermal oxidation treatment of the single crystal semiconductor substrate 510 is performed in an oxidizing atmosphere to which chlorine (Cl) is added, whereby the oxide film 512 obtained by chlorine oxidation can be formed. In this case, the oxide film 512 is a film containing chlorine atoms. By such chlorine oxidation, heavy metal (e.g., Fe, Cr, Ni, or Mo) that is an extrinsic impurity is trapped and chloride of the metal is formed and then removed to the outside; thus, contamination of the single crystal semiconductor substrate 510 can be reduced. Moreover, after the bonding to the base substrate 500, an impurity from the base substrate, such as Na, can be fixed, so that contamination of the single crystal semiconductor substrate 510 can be prevented.

Note that the halogen atoms contained in the oxide film 512 are not limited to chlorine atoms. A fluorine atom may be contained in the oxide film 512. As a method for fluorine oxidation of the surface of the single crystal semiconductor substrate 510, a method in which the single crystal semiconductor substrate 510 is soaked in an HF solution and then subjected to thermal oxidation treatment in an oxidizing atmosphere, a method in which thermal oxidation treatment is performed in an oxidizing atmosphere to which $NF_3$ is added, or the like can be used.

Next, ions are accelerated by an electric field and the single crystal semiconductor substrate 510 is irradiated with the ions, and the ions are added to the single crystal semiconductor substrate 510, whereby an embrittled region 514 where the crystal structure is damaged is formed in the single crystal semiconductor substrate 510 at a predetermined depth (see FIG. 7E).

The depth at which the embrittled region 514 is formed can be adjusted by the kinetic energy, mass, charge, or incidence angle of the ions, or the like. The embrittled region 514 is formed at approximately the same depth as the average penetration depth of the ions. Therefore, the thickness of the single crystal semiconductor layer to be separated from the single crystal semiconductor substrate 510 can be adjusted with the depth at which the ions are added. For example, the average penetration depth may be adjusted such that the thickness of the single crystal semiconductor layer is approximately greater than or equal to 10 nm and less than or equal to 500 nm, preferably greater than or equal to 50 mu and less than or equal to 200 nm.

The above ion irradiation treatment can be performed with an ion-doping apparatus or an ion-implantation apparatus. As a typical example of the ion-doping apparatus, there is a non-mass-separation type apparatus in which plasma excitation of a process gas is performed and an object to be processed is irradiated with all kinds of ion species generated. In this apparatus, the object to be processed is irradiated with ion species of plasma without mass separation. In contrast, an ion implantation apparatus is a mass-separation type apparatus. In the ion-implantation apparatus, mass separation of ion species of plasma is performed and the object to be processed is irradiated with ion species having predetermined masses.

In this embodiment, an example is described in which an ion doping apparatus is used to add hydrogen to the single crystal semiconductor substrate 510. A gas containing hydrogen is used as a source gas. As for ions used for the irradiation, the proportion of $H_3^+$ is preferably set high. Specifically, it is preferable that the proportion of $H_3^+$ be set to greater than or equal to 50% (more preferably, greater than or equal to 80%) with respect to the total amount of $H^+$, $H_2^+$, and $H_3^+$. With a high proportion of $H_3^+$, the efficiency of ion irradiation can be improved.

Note that ions to be added are not limited to ions of hydrogen. Ions of helium or the like may be added. Further, ions to be added are not limited to one kind of ions, and plural kinds of ions may be added. For example, in the case of performing irradiation with hydrogen and helium concurrently using an ion-doping apparatus, the number of steps can be reduced as compared to the case of performing irradiation with hydrogen and helium in different steps, and surface roughness of the single crystal semiconductor layer to be formed later can be suppressed.

Note that heavy metal may also be added when the embrittled region 514 is formed with the ion doping apparatus; however, when the ion irradiation is performed through the oxide film 512 containing halogen atoms, contamination of the single crystal semiconductor substrate 510 due to the heavy metal can be prevented.

Then, the base substrate 500 and the single crystal semiconductor substrate 510 are disposed to face each other, and the surface of the nitrogen-containing layer 502 and the oxide film 512 are disposed in close contact with each other. Thus, the base substrate 500 and the single crystal semiconductor substrate 510 can be bonded to each other (see FIG. 7F).

When bonding is performed, it is preferable that a pressure of greater than or equal to 0.001 N/cm$^2$ and less than or equal to 100 N/cm$^2$, e.g., a pressure of greater than or equal to 1 N/cm$^2$ and less than or equal to 20 N/cm$^2$, be applied to one part of the base substrate 500 or one part of the single crystal semiconductor substrate 510. When the bonding surfaces are made close to each other and disposed in close contact with each other by applying a pressure, a bonding between the nitrogen-containing layer 502 and the oxide film 512 is generated at the part where the close contact is made, and from that part, the bonding spontaneously spreads to almost the entire area. This bonding is performed under the action of the Van der Waals force or hydrogen bonding and can be performed at room temperature.

Note that before the single crystal semiconductor substrate 510 and the base substrate 500 are bonded to each other, surfaces to be bonded to each other are preferably subjected to surface treatment. Surface treatment can improve the bonding strength at the interface between the single crystal semiconductor substrate 510 and the base substrate 500.

As the surface treatment, wet treatment, dry treatment, or a combination of wet treatment and dry treatment can be used. Alternatively, wet treatment may be used in combination with different wet treatment or dry treatment may be used in combination with different dry treatment.

Note that heat treatment for increasing the bonding strength may be performed after bonding. This heat treatment is performed at a temperature at which separation at the embrittled region 514 does not occur (for example, a temperature of greater than or equal to room temperature and less than 400° C.). Alternatively, bonding of the nitrogen-containing layer 502 and the oxide film 512 may be performed while heating them at a temperature in this range. The heat treatment can be performed using a diffusion furnace, a heating furnace such as a resistance heating furnace, a rapid thermal annealing (RTA) apparatus, a microwave heating apparatus, or the like. The above temperature condition is merely an example, and an embodiment of the invention disclosed herein should not be construed as being limited to this example.

Next, heat treatment is performed for separation of the single crystal semiconductor substrate 510 at the embrittled region, whereby a single crystal semiconductor layer 516 is formed over the base substrate 500 with the nitrogen-containing layer 502 and the oxide film 512 interposed therebetween (see FIG. 7G).

Note that the temperature for the heat treatment in the separation is desirably as low as possible. This is because as the temperature in the separation is low, generation of roughness on the surface of the single crystal semiconductor layer 516 can be suppressed. Specifically, the temperature of the heat treatment in the separation may be greater than or equal to 300° C. and less than or equal to 600° C., and the heat treatment is more effective when the temperature is greater than or equal to 400° C. and less than or equal to 500° C.

Note that after the single crystal semiconductor substrate 510 is separated, the single crystal semiconductor layer 516 may be subjected to heat treatment at greater than or equal to 500° C. so that the concentration of hydrogen remaining in the single crystal semiconductor layer 516 may be reduced.

Then, the surface of the single crystal semiconductor layer 516 is irradiated with laser light, whereby a single crystal semiconductor layer 518 in which the planarity of the surface is improved and the number of defects is reduced is formed (see FIG. 7H). Note that instead of the laser light irradiation treatment, heat treatment may be performed.

Although the irradiation treatment with the laser light is performed immediately after the heat treatment for separation of the single crystal semiconductor layer 516 in this embodiment, an embodiment of the present invention is not construed as being limited to this. Etching treatment may be performed after the heat treatment for separation of the single crystal semiconductor layer 516, to remove a region where there are many defects on the surface of the single crystal semiconductor layer 516, and then the laser light irradiation treatment may be performed. Alternatively, after the surface planarity of the single crystal semiconductor layer 516 is improved, the laser light irradiation treatment may be performed. Note that the etching treatment may be either wet etching or dry etching. Further, in this embodiment, a step of reducing the thickness of the single crystal semiconductor layer 516 may be performed after the laser light irradiation. In order to reduce the thickness of the single crystal semiconductor layer 516, one of or both dry etching and wet etching may be employed.

Through the above steps, an SOI substrate including the single crystal semiconductor layer 518 with favorable characteristics can be obtained (see FIG. 7H).

<Method for Manufacturing Semiconductor Device>
<Method for Manufacturing Transistor in Lower Portion>

Next, a method for manufacturing a semiconductor device, particularly, the transistor 560, using the above SOI substrate will be described with reference to FIGS. 8A to 8E. Note that FIGS. 8A to 8E illustrate part of the SOI substrate formed by the method illustrated in FIGS. 7A to 7H, and are cross-sectional views illustrating the transistor in the lower portion illustrated in FIG. 6A.

Figure 8A:
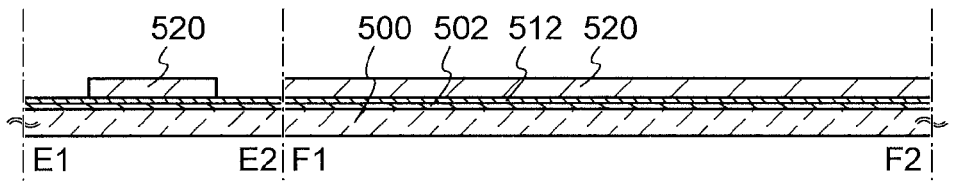
FIGS. 8A to 8E are cross-sectional views illustrating a manufacturing process of a semiconductor device.

First, the single crystal semiconductor layer 518 is processed into an island shape, so that a semiconductor layer 520 is formed (see FIG. 8A). Note that before or after this step, an impurity element imparting n-type conductivity or an impurity element imparting p-type conductivity may be added to the semiconductor layer in order to control the threshold voltage of the transistor. In the case where silicon is used as the semiconductor, for example, phosphorus, arsenic, or the like can be used as an impurity element imparting n-type conductivity. On the other hand, for example, boron, aluminum, gallium, or the like can be used as an impurity element imparting p-type conductivity.

Figure 8B:
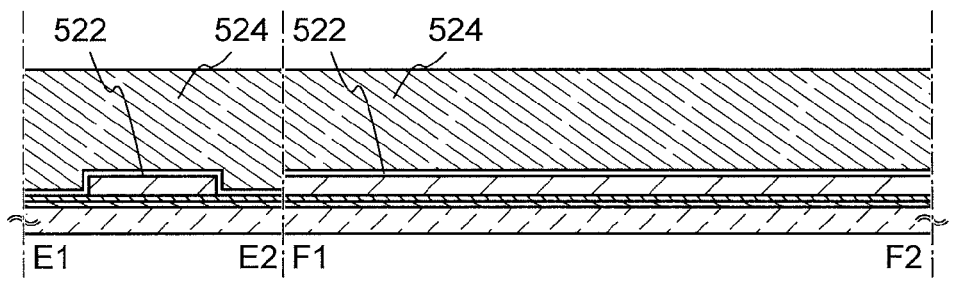

Next, an insulating layer 522 is formed so as to cover the semiconductor layer 520, and a conductive layer 524 is formed over the insulating layer 522 (see FIG. 8B).

The insulating layer 522 is to be a gate insulating layer later. The insulating layer 522 can be formed, for example, by performing heat treatment (thermal oxidation treatment, thermal nitridation treatment, or the like) on a surface of the semiconductor layer 520. Instead of the heat treatment, high-density plasma treatment may be employed. The high-density plasma treatment can be performed using, for example, a mixed gas of a rare gas such as He, Ar, Kr, or Xe and any of oxygen, nitrogen oxide, ammonia, nitrogen, and hydrogen. Needless to say, the insulating layer may be formed by a CVD method, a sputtering method, or the like. The insulating layer preferably has a single-layer structure or a layered structure including one or more of silicon oxide, silicon oxynitride, silicon nitride, hafnium oxide, aluminum oxide, tantalum oxide, yttrium oxide, hafnium silicate, hafnium silicate to which nitrogen is added, hafnium aluminate to which nitrogen is added, and the like. The insulating layer can have a thickness of, for example, greater than or equal to 1 nm and less than or equal to 100 nm, preferably greater than or equal to 10 nm and less than or equal to 50 nm. In this embodiment, a single-layer insulating layer containing silicon oxide is formed by a plasma CVD method.

The conductive layer 524 is to be a gate electrode later. The conductive layer 524 can be fainted using a metal material such as aluminum, copper, titanium, tantalum, or tungsten. The conductive layer may be formed using a semiconductor material such as polycrystalline silicon. In addition, the conductive layer 524 may have either a single-layer structure or a layered structure. There is no particular limitation on the method for forming the conductive layer 524, and any of a variety of film formation methods such as an evaporation method, a CVD method, a sputtering method, and a spin coating method can be employed. In this embodiment, for example, the conductive layer 524 has a structure in which three layers of a tantalum nitride layer, a tungsten layer, and a tantalum nitride layer are stacked in order from a layer in contact with the insulating layer.

Figure 8C:
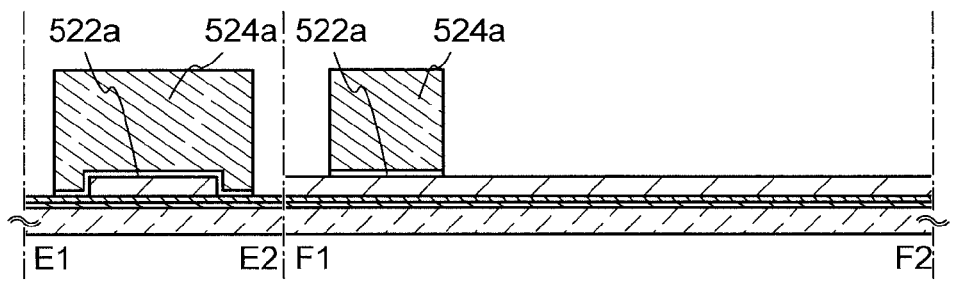

Next, the insulating layer 522 and the conductive layer 524 are selectively etched, so that the gate insulating layer 522a and the gate electrode 524a are formed over the semiconductor layer 520 (see FIG. 8C). As the etching, dry etching is preferably performed, but wet etching can be performed. An etching gas and an etchant can be selected as appropriate depending on a material of a layer to be etched.

Figure 8D:
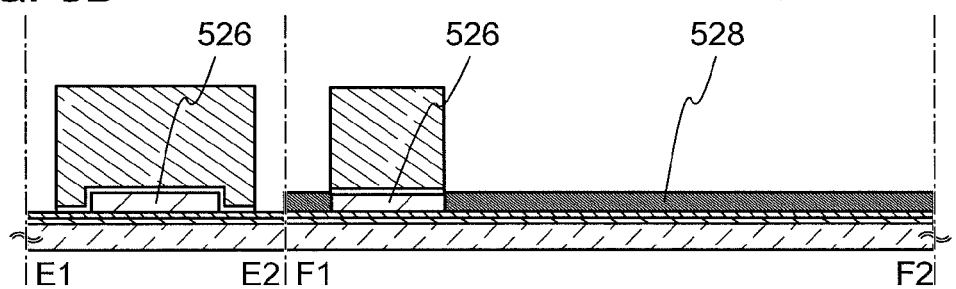

Next, an impurity element imparting one conductivity type is added to the semiconductor layer 520 with the gate electrode 524*a* used as a mask, so that the channel formation region 526 and the impurity regions 528 are formed (see FIG. 8D). Note that in this embodiment, phosphorus (P) or arsenic (As) is added in order to form an n-channel transistor; an impurity element such as boron (B) or aluminum (Al) may be added when a p-channel transistor is formed. Here, the concentration of an impurity to be added can be set as appropriate. In addition, after the impurity element is added, heat treatment for activation is performed.

Note that when the semiconductor layer 520 is formed using a material containing silicon, a silicide region may be formed by forming silicide in part of the semiconductor layer 520 in order to further reduce the resistance of a source region and a drain region. The silicide region is formed in such a manner that metal is brought into contact with the semiconductor layer, and silicon in the semiconductor layer is made to react with the metal by heat treatment (e.g., a GRTA method, an LRTA method, or laser irradiation). For the silicide, for example, cobalt silicide, nickel silicide, or the like may be formed. In the case where the semiconductor layer 520 is thin, silicide reaction may proceed to a bottom of the semiconductor layer 520. As a metal material used for forming silicide, titanium, tungsten, molybdenum, zirconium, hafnium, tantalum, vanadium, neodymium, chromium, platinum, palladium, and the like can be given in addition to cobalt and nickel.

Next, the electrode 530 is formed in a region which is in contact with part of the impurity region 528. After that, the insulating layer 534 is formed so as to cover the components formed in the above steps (see FIG. 8E).

For example, the electrode 530 is formed in such a manner that a layer including a conductive material is formed and then the layer is selectively etched. The layer including a conductive material can be formed using a metal material such as aluminum, copper, titanium, tantalum, or tungsten. The layer including a conductive material may be formed using a semiconductor material such as polycrystalline silicon. There is no particular limitation on the method for forming the layer including a conductive material, and any of a variety of film formation methods such as an evaporation method, a CVD method, a sputtering method, and a spin coating method can be employed.

Alternatively, the electrode 530 can be formed by forming an opening reaching the impurity region 528 in the insulating layer 534 after the formation of the insulating layer 534 and then by filling the opening.

The insulating layer 534 can be formed using an inorganic insulating material such as silicon oxide, silicon oxynitride, silicon nitride, or aluminum oxide. It is particularly preferable to use a low dielectric constant (low-k) material for the insulating layer 534 because capacitance due to overlap of electrodes or wirings can be sufficiently reduced. Note that the insulating layer 534 may be a porous insulating layer formed using any of those materials. Since the porous insulating layer has low dielectric constant as compared to a dense insulating layer, capacitance due to electrodes or wirings can be further reduced. Alternatively, the insulating layer 534 can be formed using an organic insulating material such as polyimide or acrylic. Note that although the insulating layer 534 has a layered structure here, an embodiment of the invention disclosed herein is not limited to this. A single-layer structure or a layered structure including three or more layers can be used.

Figure 8E:
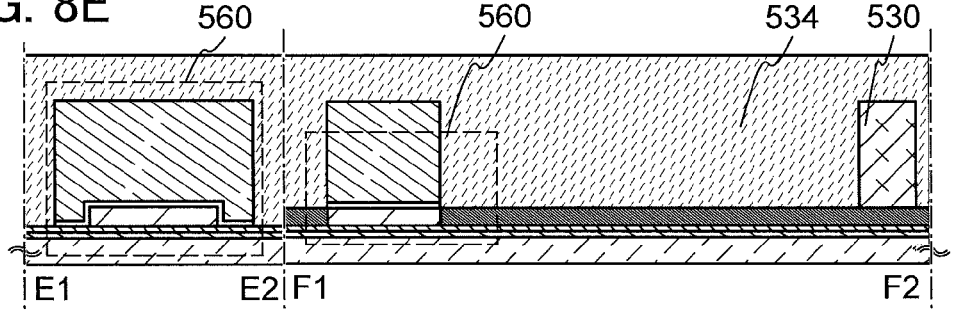

Through the above steps, the transistor 560 formed using the SOI substrate is manufactured (see FIG. 8E). Since the transistor 560 is capable of high-speed operation, when the transistor is used as a reading transistor, high-speed reading operation is possible. Further, a logic circuit (also referred to as an arithmetic circuit) or the like can be formed using the transistor 560.

Then, CMP treatment is performed on the insulating layer 534 to expose upper surfaces of the gate electrode 524*a* and the electrode 530 (not illustrated). As treatment for exposing the upper surfaces of the gate electrode 524*a* and the electrode 530, as well as CMP treatment, etching treatment or the like can be employed; in order to improve characteristics of the transistor 562 which is formed later, the surface of the insulating layer 534 is preferably made as planar as possible.

Note that before or after the above steps, a step for forming an additional electrode, wiring, semiconductor layer, insulating layer, or the like may be performed. For example, a multilayer wiring structure in which an insulating layer and a conductive layer are stacked is employed as a wiring structure, so that a highly integrated semiconductor device can be provided.

<Method for Manufacturing Transistor in Upper Portion>

Figure 9A:
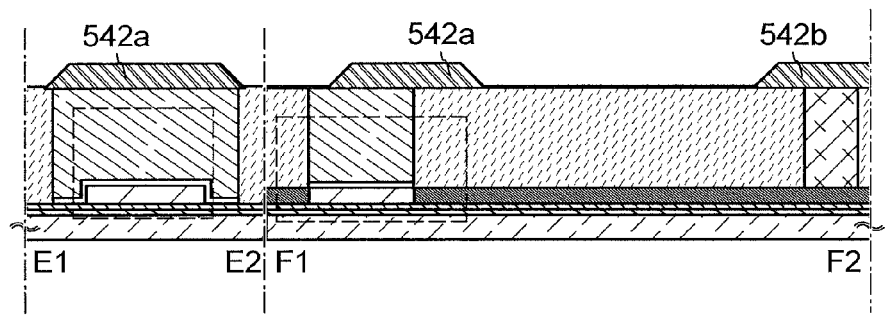
FIGS. 9A to 9C are cross-sectional views illustrating a manufacturing process of a semiconductor device.

Next, a conductive layer is formed over the gate electrode 524*a*, the electrode 530, the insulating layer 534, and the like, and the source electrode 542*a* and the drain electrode 542*b* are formed by selectively etching the conductive layer (see FIG. 9A). Note that the conductive layer may be formed using a material having etching selectivity with respect to the gate electrode 524*a*, and the etching selectivity of the conductive layer with respect to the gate electrode 524*a* is preferably greater than or equal to 2, more preferably greater than or equal to 3. In this embodiment, for example, a tungsten layer is used as the conductive layer for forming the source electrode 542*a* and the drain electrode 542*b*.

The conductive layer for forming the source electrode 542*a* and the drain electrode 542*b* is formed using a material having etching selectivity with respect to the gate electrode 524*a*. Accordingly, even when misalignment is caused in formation of the source electrode 542*a* and the drain electrode 542*b*, the gate electrode 524*a* can be prevented from being etched. Therefore, it is not necessary to design the layout in consideration of a margin of the source electrode 542*a* for overlapping with the gate electrode 524*a*, and the degree of integration can be increased.

The channel length (L) of the transistor 562 in the upper portion is determined by the width of the gate electrode 548*a* in the channel length direction (the direction of carrier flow). Further, the width of an offset region in the channel length direction (the offset width) is determined by the distance between the lower end portion of the source electrode 542*a* and the lower end portion of the drain electrode 542*b* and the width of the gate electrode 548*a* in the channel length direction. For the material and film formation conditions of the conductive layer for forming the source electrode 542*a* and the drain electrode 542*b*, the material and film formation conditions of the conductive layer for forming the source electrode 142*a* and the drain electrode 142*b* described in Embodiment 1 can be employed.

Figure 9B:
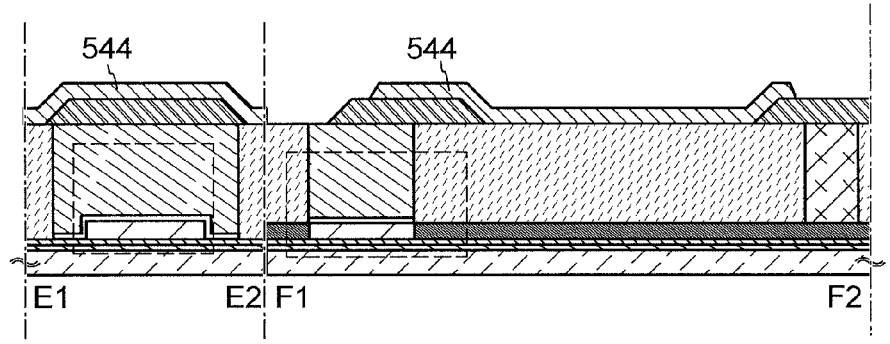
Figure 9C:
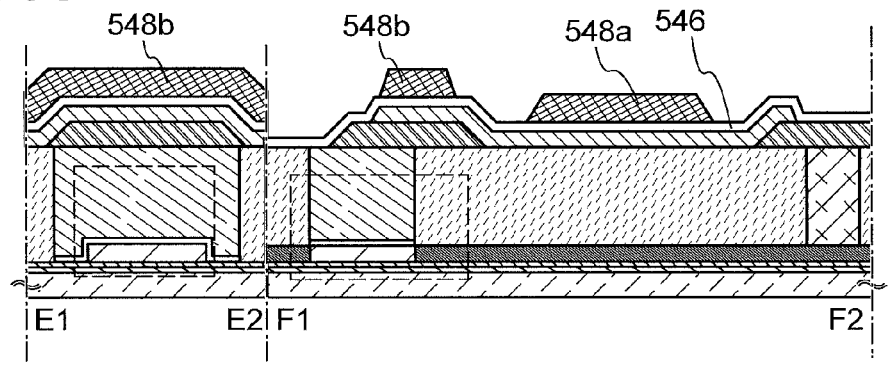

Next, the oxide semiconductor layer 544 is formed by forming an oxide semiconductor layer so as to cover the source electrode 542*a* and the drain electrode 542*b* and then by selectively etching the oxide semiconductor layer (see FIG. 9B). Note that for the material and formation conditions of the oxide semiconductor layer 544, the material and formation conditions of the oxide semiconductor layer 144 described in Embodiment 1 can be employed.

Heat treatment (first heat treatment) is preferably performed on the oxide semiconductor layer which is formed. Excessive hydrogen (including water and a hydroxyl group) in the oxide semiconductor layer can be removed by the first heat treatment. The temperature of the first heat treatment is, for example, greater than or equal to 300° C. and less than 550° C., or greater than or equal to 400° C. and less than or equal to 500° C.

The oxide semiconductor layer may be etched either before or after the heat treatment. In view of miniaturization of elements, dry etching is preferably used; however, wet etching may be used. An etching gas and an etchant can be selected as appropriate depending on a material of a layer to be etched.

Next, the gate insulating layer 546 which covers the source electrode 542a, the drain electrode 542b, and the oxide semiconductor layer 544 is formed. After that, over the gate insulating layer 546, the gate electrode 548a is formed in a region overlapping with part of the oxide semiconductor layer 544, and the electrode 548b is formed in a region overlapping with the source electrode 542a (see FIG. 9C). Note that for the material and formation conditions of the gate insulating layer 546, the material and formation conditions of the gate insulating layer 146 described in Embodiment 1 can be employed.

After the gate insulating layer 546 is formed, second heat treatment is preferably performed in an inert gas atmosphere or an oxygen atmosphere. The temperature of the heat treatment is set to greater than or equal to 200° C. and less than or equal to 450° C., preferably greater than or equal to 250° C. and less than or equal to 350° C. For example, the heat treatment may be performed at 250° C. for 1 hour in a nitrogen atmosphere. The second heat treatment can reduce variation in electric characteristics of the transistor. Moreover, in the case where the gate insulating layer 546 contains oxygen, oxygen is supplied to the oxide semiconductor layer 544 which has been subjected to the dehydration treatment or dehydrogenation treatment to compensate for oxygen deficiency in the oxide semiconductor layer 544, whereby an i-type (intrinsic) or substantially i-type oxide semiconductor layer can be formed.

As described above, the first heat treatment and the second heat treatment are performed, whereby the oxide semiconductor layer 544 can be highly purified in order to include an impurity other than its main component as little as possible.

The gate electrode 548a and the electrode 548b can be formed in such a manner that a conductive layer is formed over the gate insulating layer 546 and then selectively etched. The conductive layer for forming the gate electrode 548a and the electrode 548b can be formed by a PVD method such as a sputtering method or a CVD method such as a plasma CVD method. The details are similar to those of the source electrode 542a and the drain electrode 542b; thus, the description thereof can be referred to.

Note that the width of the gate electrode 548a in the channel length direction may be appropriately set so that an offset region is provided, in the oxide semiconductor layer 544, in at least one of a region between the source electrode 542a and the channel formation region and a region between the drain electrode 542b and the channel formation region. Note that the width of the offset region ($L_{off\_S}$) on the source electrode side and the width of the offset region ($L_{off\_D}$) on the drain electrode side are not necessarily the same, but the total value of $L_{off\_S}$ and $L_{off\_D}$ of the transistor 562 is the same as those of other transistors 562. $L_{off\_S}$ or $L_{off\_D}$ needs to be at least greater than 0 nm and is preferably less than or equal to 2 μm.

The offset region serves as a resistance region which is not affected or is difficult to be affected by an electric field of the gate electrode when the transistor is driven, and is therefore effective in further reducing the off-state current of the transistor 562. In the transistor 562, the offset region is not necessarily provided. In addition, in the transistor 162 described in Embodiment 1, the offset region may be faulted.

Note that it is preferable that the offset region be provided at least on the source electrode 542a side. By providing an offset region on the source electrode 542a side, parasitic capacitance between the gate electrode 548a of the transistor 562 and a portion (a floating gate portion) where the source electrode 542a and the gate electrode 524a of the transistor 560 are electrically connected to each other can be reduced. As a result, in writing or reading operations, the gate electrode 548a of the transistor 562 has less influence on the potential of the floating gate portion, whereby a semiconductor device capable of stable operation can be provided.

The electrode 548b, which serves as a capacitor electrode, is preferably formed to overlap with at least part of the gate electrode 524a of the transistor 560. This is because by employing such a structure, the area of the circuit can be sufficiently reduced.

Figure 10A:
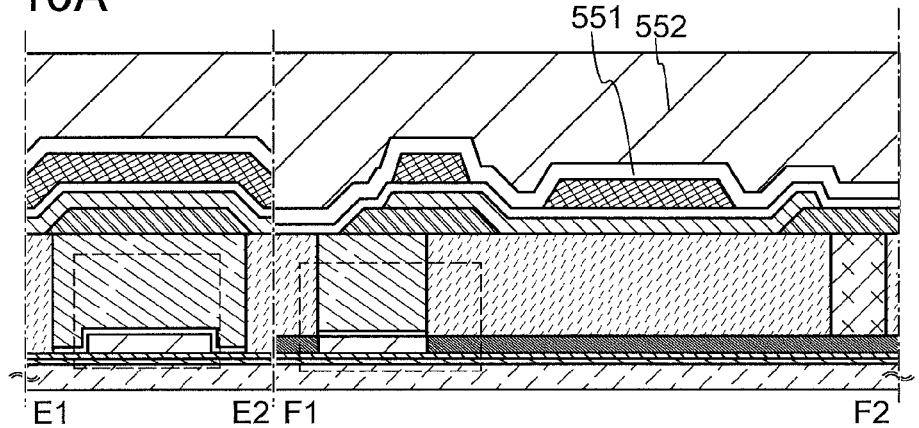
FIGS. 10A to 10C are cross-sectional views illustrating a manufacturing process of a semiconductor device.

Then, as in a step in FIG. 5A described in Embodiment 1, the insulating layer 551 and the insulating layer 552 are formed over the gate insulating layer 546, the gate electrode 548a, and the electrode 548b (see FIG. 10A).

Figure 10B:
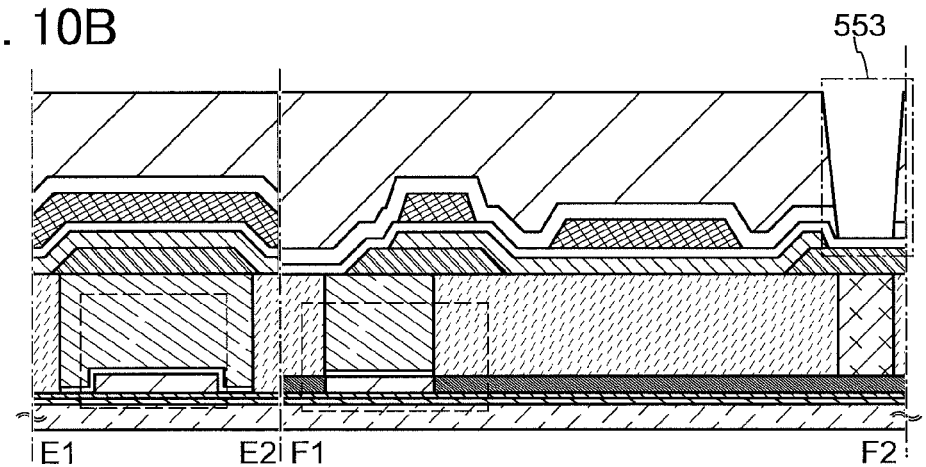

Next, an opening 553 reaching the drain electrode 542b is formed in the gate insulating layer 546, the insulating layer 551, and the insulating layer 552 (see FIG. 10B). The opening 553 is fanned by selective etching with the use of a mask or the like.

Here, the opening 553 is preferably formed in a region overlapping with the electrode 530. By forming the opening 553 in such a region, the area of an element can be prevented from being increased which is caused due to the contact region of the electrode. In other words, the degree of integration of the semiconductor device can be increased.

Figure 10C:
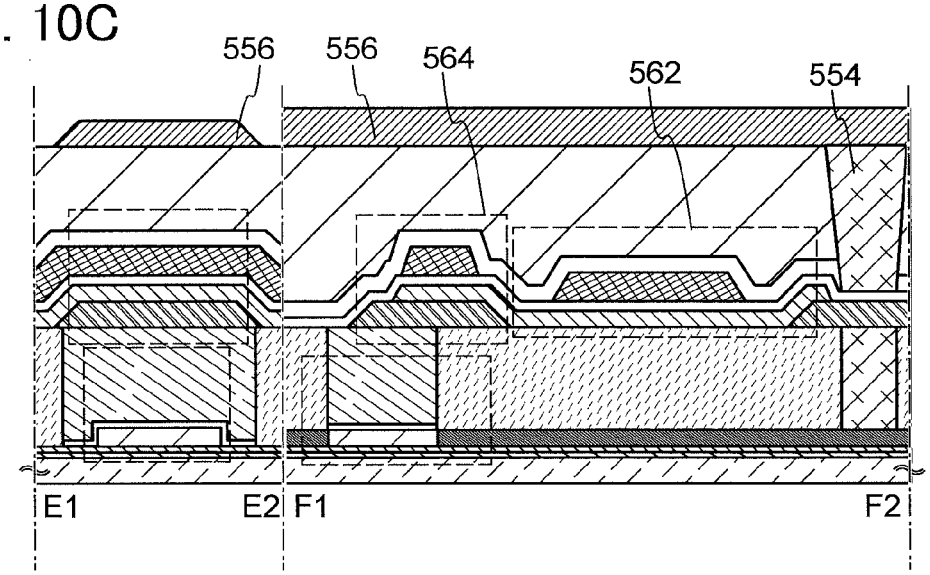

Then, as in a step in FIG. 5C described in Embodiment 1, the electrode 554 is formed in the opening 553 and the wiring 556 in contact with the electrode 554 is formed over the insulating layer 552 (see FIG. 10C).

Through the above steps, the transistor 562 including the highly purified oxide semiconductor layer 544 and the capacitor 564 are completed (see FIG. 10C).

In the transistor 562 described in this embodiment, the oxide semiconductor layer 544 is highly purified and thus the hydrogen concentration thereof is less than or equal to $5 \times 10^{19}$ atoms/cm$^3$, preferably less than or equal to $5 \times 10^{18}$ atoms/cm$^3$, more preferably less than or equal to $5 \times 10^{17}$ atoms/cm$^3$. The oxide semiconductor layer 544 has a sufficiently low carrier density (e.g., less than $1 \times 10^{12}$/cm$^3$, preferably less than $1.45 \times 10^{10}$/cm$^3$) as compared to a general silicon wafer having a carrier density of approximately $1 \times 10^{14}$/cm$^3$. As a result of this, a sufficiently small off-state current can be obtained.

With the use of the oxide semiconductor layer 544 which is highly purified and becomes intrinsic, the off-state current of the transistor can be sufficiently reduced. Then, by using such a transistor, a semiconductor device in which stored data can be held for an extremely long time can be obtained.

Further, an oxide semiconductor has a wide energy gap of 3.0 eV to 3.5 eV and a very small number of thermally excited carriers. Therefore, characteristics of the transistor 562 including an oxide semiconductor do not deteriorate and an off-state current can be kept extremely small even at high temperatures. In particular, provision of an offset region in the oxide semiconductor layer 544 of the transistor 562 is effective in further reducing the off-state current of the transistor 562.

In addition, in the semiconductor device described in this embodiment, the source electrode 542a of the transistor 562 in the upper portion which is provided on and in contact with the gate electrode 524a of the transistor 560 in the lower portion is formed using a material having etching selectivity with respect to the gate electrode 524a. Therefore, when a pattern of the source electrode 542a is formed, the gate electrode 524a is not etched, and it is not necessary to provide a margin of the source electrode 542a for covering the gate electrode 524a in consideration of misalignment of a pattern of the source electrode 542a, whereby the layout area can be reduced. Accordingly, a semiconductor device with an increased degree of integration can be provided.

The structures, methods, and the like described in this embodiment can be combined as appropriate with any of the structures, methods, and the like described in other embodiments.

Embodiment 3

In this embodiment, a circuit configuration and operation of a semiconductor device according to an embodiment of the invention disclosed herein will be described with reference to FIGS. 11A-1 to 11B. In the description of circuit diagrams in FIGS. 11A-1 to 11B, reference numerals are the same as those in the semiconductor device in FIGS. 1A and 1B. Note that in each of the circuit diagrams, "OS" may be written beside a transistor in order to indicate that the transistor includes an oxide semiconductor.

Figures 1, 11A:
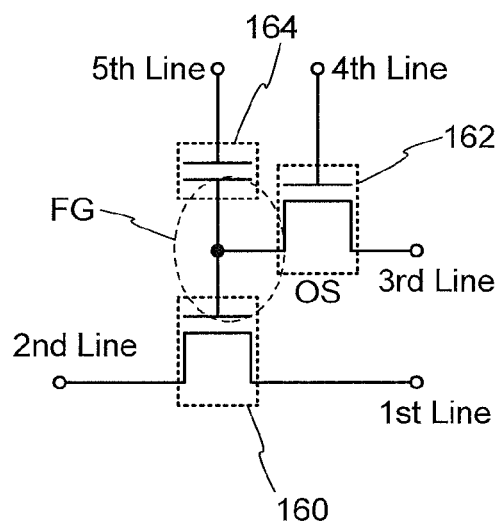
FIGS. 11A-1 to 11B are circuit diagrams of a semiconductor device.

In the semiconductor device illustrated in FIG. 11A-1, a first wiring (a 1st line) and a source electrode of a transistor 160 are electrically connected to each other. A second wiring (a 2nd line) and a drain electrode of the transistor 160 are electrically connected to each other. A third wiring (a 3rd line) and one of a source electrode and a drain electrode of a transistor 162 are electrically connected to each other, and a fourth wiring (a 4th line) and a gate electrode of the transistor 162 are electrically connected to each other. A gate electrode of the transistor 160 and the other of the source electrode and the drain electrode of the transistor 162 are electrically connected to one electrode of a capacitor 164, and a fifth wiring (a 5th line) and the other electrode of the capacitor 164 are electrically connected to each other.

Here, the above transistor including an oxide semiconductor is used as the transistor 162, for example. The transistor including an oxide semiconductor has a characteristic of a significantly small ofd state current. For that reason, a potential of the gate electrode of the transistor 160 can be held for an extremely long time by turning of the transistor 162. Provision of the capacitor 164 facilitates holding of charge given to the gate electrode of the transistor 160 and reading of stored data Note that it is needless to say that the transistor 562 can be employed instead of the transistor 162.

Note that there is no particular limitation on the transistor 160. In terms of increasing the speed of reading data, it is preferable to use, for example, a transistor with high switching rate such as a transistor including single crystal silicon.

Figure 11B:
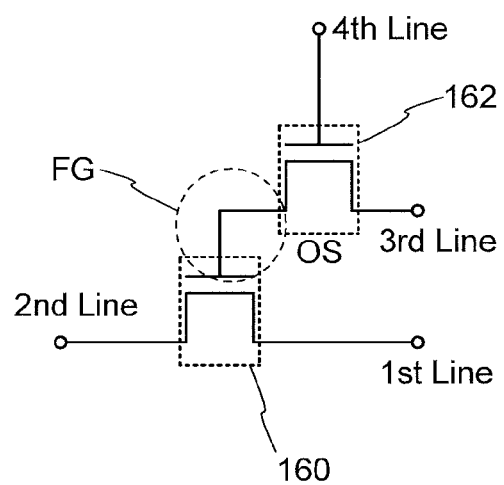

In addition, a structure in which the capacitor 164 is not provided as illustrated in FIG. 11B can be employed.

The semiconductor device in FIG. 11A-1 can write, hold, and read data as described below, utilizing a characteristic in which the potential of the gate electrode of the transistor 160 can be held.

First, writing and holding of data will be described. First, the potential of the fourth wiring is set to a potential at which the transistor 162 is turned on, so that the transistor 162 is turned on. Accordingly, the potential of the third wiring is supplied to the gate electrode of the transistor 160 and the capacitor 164. That is, predetermined charge is given to the gate electrode of the transistor 160 (writing). Here, any of charges for applying two different levels of potentials (hereinafter, charge for applying a low potential is referred to as charge $Q_L$ and charge for applying a high potential is referred to as charge $Q_H$) is applied through the third wiring. Note that charges for applying three or more different levels of potentials may be applied to improve storage capacity. After that, the potential of the fourth wiring is set to a potential at which the transistor 162 is turned off, so that the transistor 162 is turned off. Thus, the charge given to the gate electrode of the transistor 160 is held (holding).

Since the off-state current of the transistor 162 is significantly small, the charge of the gate electrode of the transistor 160 is held for a long time.

Next, reading of data will be described. By supplying an appropriate potential (reading potential) to the fifth wiring while a predetermined potential (constant potential) is supplied to the first wiring, the potential of the second wiring varies depending on the amount of charge held in the gate electrode of the transistor 160. This is because in general, when the transistor 160 is an n-channel transistor, an apparent threshold voltage $V_{th\_H}$ in the case where $Q_H$ is given to the gate electrode of the transistor 160 is lower than an apparent threshold voltage $V_{th\_L}$ in the case where $Q_L$ is given to the gate electrode of the transistor 160. Here, an apparent threshold voltage refers to the potential of the fifth wiring, which is needed to turn on the transistor 160. Thus, by setting the potential of the fifth wiring to a potential $V_0$ which is between $V_{th\_H}$ and $V_{th\_L}$, charge applied to the gate electrode of the transistor 160 can be determined. For example, in the case where $Q_H$ is given in writing, when the potential of the fifth wiring is set to $V_0$ ($>V_{th\_H}$), the transistor 160 is turned on. In the case where $Q_L$ is given in writing, even when the potential of the fifth wiring is set to $V_0$ ($V_{th\_L}$), the transistor 160 remains in an off state. Therefore, the held data can be read on the basis of the potential of the second wiring.

Note that in the case where memory cells are arrayed to be used, only data of desired memory cells is needed to be read. Thus, in the case where data of predetermined memory cells is read and data of the other memory cells is not read, a potential at which the transistor 160 is turned off regardless of a state of the gate electrode, that is, a potential lower than $V_{th\_H}$ may be applied to fifth wirings of the memory cells whose data is not to be read. Alternatively, a potential at which the transistor 160 is turned on regardless of a state of the gate electrode, that is, a potential higher than $V_{th\_L}$ may be applied to the fifth wirings.

Then, rewriting of data will be described. Rewriting of data is performed in a manner similar to that of the writing and holding of data. That is, the potential of the fourth wiring is set to a potential at which the transistor 162 is turned on, so that the transistor 162 is turned on. Accordingly, the potential of the third wiring (potential related to new data) is supplied to the gate electrode of the transistor 160 and the capacitor 164. After that, the potential of the fourth wiring is set to a potential at which the transistor 162 is turned off, so that the transistor 162 is turned off. In this manner, charge related to new data is given to the gate electrode of the transistor 160.

In the semiconductor device according to the invention disclosed herein, data can be directly rewritten by another writing of data as described above. Therefore, extracting of charge from a floating gate with the use of a high voltage needed in a flash memory or the like is not necessary, and thus, reduction in operation speed, which is attributed to erasing operation, can be suppressed. In other words, high-speed operation of the semiconductor device can be realized.

Note that the source electrode or the drain electrode of the transistor 162 is electrically connected to the gate electrode of the transistor 160, thereby having an effect similar to that of a floating gate of a floating gate transistor used for a non-volatile memory element. Therefore, a portion in the drawing where the source electrode or the drain electrode of the transistor 162 is electrically connected to the gate electrode of the transistor 160 is called a floating gate portion FG in some cases. When the transistor 162 is off, the floating gate portion FG can be regarded as being embedded in an insulator and thus charge is held in the floating gate portion FG. The amount of off-state current of the transistor 162 including an oxide semiconductor is less than or equal to one hundred thousandth of the amount of the off-state current of a transistor including a silicon semiconductor; thus, loss of the charge accumulated in the floating gate portion FG due to a leakage current of the transistor 162 is negligible. That is, with the transistor 162 including an oxide semiconductor, a non-volatile storage device which can hold data even when power is not supplied can be realized.

For example, when the off-state current of the transistor 162 is less than or equal to 10 zA (1 zA (zeptoampere) is $1 \times 10^{-21}$ A) at room temperature (25° C.) and the capacitance value of the capacitor 164 is approximately 10 fF, data can be held for at least greater than or equal to $10^4$ seconds. It is needless to say that the holding time depends on transistor characteristics and the capacitance value.

Further, in that case, the problem of deterioration of a gate insulating film (tunnel insulating film), which has been pointed out in a conventional floating gate transistor, does not exist. That is, the deterioration of a gate insulating film due to injection of an electron into a floating gate, which has been traditionally regarded as a problem, can be solved. This means that there is no limit on the number of times of writings in principle. Furthermore, a high voltage needed for writing or erasing in a conventional floating gate transistor is not necessary.

Figures 2, 11A:
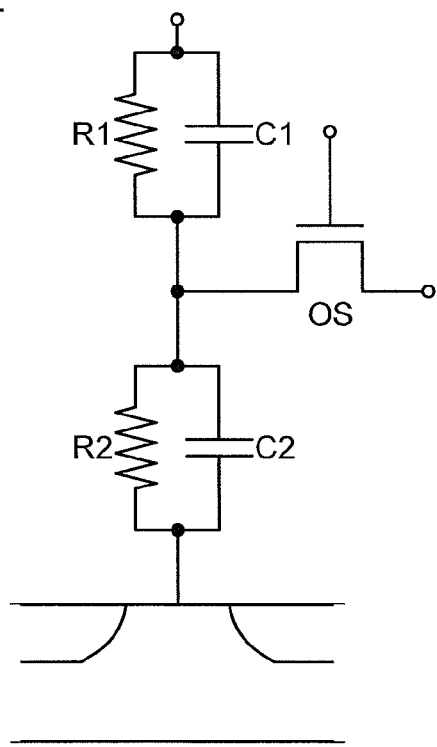

Components such as the transistors in the semiconductor device in FIG. 11A-1 can be regarded as including resistors and capacitors as illustrated in FIG. 11A-2. That is, in FIG. 11A-2, the transistor 160 and the capacitor 164 are each regarded as including a resistor and a capacitor. R1 and C1 denote the resistance value and the capacitance value of the capacitor 164, respectively. The resistance value R1 corresponds to the resistance value which depends on an insulating layer included in the capacitor 164. R2 and C2 denote the resistance value and the capacitance value of the transistor 160, respectively. The resistance value R2 corresponds to the resistance value which depends on a gate insulating layer at the time when the transistor 160 is on. The capacitance value C2 corresponds to the capacitance value of so-called gate capacitance (capacitance formed between a gate electrode and the source electrode or the drain electrode and capacitance formed between the gate electrode and a channel formation region).

A charge holding period (also referred to as a data holding period) is determined mainly by an off-state current of the transistor 162 under the conditions that gate leakage of the transistor 162 is sufficiently small and that R1≥ROS and R2≥ROS are satisfied, where the resistance value (also referred to as effective resistance) between the source electrode and the drain electrode in the case where the transistor 162 is off is ROS.

On the other hand, when the conditions are not met, it is difficult to sufficiently secure the holding period even if the off-state current of the transistor 162 is small enough. This is because leakage current other than the off-state current of the transistor 162 (e.g., leakage current generated between the source electrode and the gate electrode of the transistor 160) is large. Thus, it can be said that the semiconductor device disclosed in this embodiment desirably satisfies the above relation.

It is desirable that C1≥C2 be satisfied. This is because when C1 is large, the potential of the fifth wiring can be supplied to the floating gate portion FG efficiently at the time of controlling the potential of the floating gate portion FG by the fifth wiring, and a difference between potentials (e.g., the reading potential and a non-reading potential) supplied to the fifth wiring can be kept low.

When the above relation is satisfied, a more preferable semiconductor device can be realized. Note that R1 and R2 depend on the gate insulating layer of the transistor 160 and the insulating layer of the capacitor 164. The same relation is applied to C1 and C2. Therefore, the material, the thickness, and the like of the gate insulating layer are desirably set as appropriate to satisfy the above relation.

In the semiconductor device described in this embodiment, the floating gate portion FG has an effect similar to that of a floating gate of a floating gate transistor of a flash memory or the like, but the floating gate portion FG of this embodiment has a feature which is essentially different from that of the floating gate of the flash memory or the like. In the case of a flash memory, since a voltage applied to a control gate is high, it is necessary to keep a proper distance between cells in order to prevent the potential from affecting a floating gate of the adjacent cell. This is one of inhibiting factors for higher integration of the semiconductor device. The factor is attributed to a basic principle of a flash memory, in which a tunneling current flows by applying a high electric field.

In contrast, the semiconductor device according to this embodiment is operated by switching of the transistor including an oxide semiconductor and does not use the above-described principle of charge injection by tunneling current. That is, a high electric field for charge injection is not necessary unlike a flash memory. Accordingly, it is not necessary to consider an influence of a high electric field from a control gate on the adjacent cell, which facilitates higher integration.

In addition, it is also advantageous that a high electric field is unnecessary and a large peripheral circuit (such as a booster circuit) is unnecessary as compared to a flash memory. For example, the highest voltage applied to the memory cell according to this embodiment (the difference between the highest potential and the lowest potential which are applied to terminals of the memory cell at the same time) can be less than or equal to 5 V, preferably less than or equal to 3 V, in each memory cell in the case where data of two levels (one bit) is written.

In the case where the relative dielectric constant $\in$r1 of the insulating layer included in the capacitor 164 is made different from the relative dielectric constant $\in$r2 of the insulating layer included in the transistor 160, C1 can easily be made greater than or equal to C2 (C1≥C2) while S1 which is the area of the insulating layer included in the capacitor 164 and S2 which is the area of the insulating layer forming gate capacitance of the transistor 160 satisfy the relation where 2·S2 is greater than or equal to S1 (2·S2≥S1), desirably S2 is greater than or equal to S1 (S2≥S1). In other words, C1 can easily be made greater than or equal to C2 (C1≥C2) while the area of the insulating layer included in the capacitor 164 is made small. Specifically, for example, by employing a film formed of a high-k material such as hafnium oxide or a stack of a film formed of a high-k material such as hafnium oxide and a film formed of an oxide semiconductor for the insulating layer included in the capacitor 164, $\in$r1 can be set to greater than or equal to 10, preferably greater than or equal to 15, and by employing silicon oxide for the insulating layer forming the gate capacitance, $\in$r2 can be set to 3 to 4.

Combination of such structures enables higher integration of the semiconductor device according to the invention disclosed herein.

Note that in addition to the increase in the degree of integration, a multilevel technique can be employed in order to increase the storage capacity of the semiconductor device. For example, three or more levels of data are written to one memory cell, whereby the storage capacity can be increased as compared to the case where two levels of data are written. The multilevel technique can be achieved by, for example, giving charge Q, which is different from charge $Q_L$ for supplying a low potential and charge $Q_H$ for supplying a high potential, to the gate electrode of the transistor 160, in addition to the charge $Q_L$ and the charge $Q_H$. In this case, enough storage capacity can be ensured even when a circuit configuration in which $F^2$ (the cell size in terms of the minimum feature size) is not sufficiently small is employed.

Note that an n-channel transistor in which electrons are majority carriers is used in the above description; it is needless to say that a p-channel transistor in which holes are majority carriers can be used instead of the n-channel transistor.

As described above, the semiconductor device according to this embodiment is suitable for increasing the degree of integration. Note that according to an embodiment of the invention disclosed herein, a wiring is shared and the contact area is reduced; thus, a semiconductor device in which the degree of integration is further increased can be provided.

The structures, methods, and the like described in this embodiment can be combined as appropriate with any of the structures, methods, and the like described in other embodiments.

Embodiment 4

In this embodiment, an application example of the semiconductor device described in the above embodiment will be described. Specifically, an example of a semiconductor device in which the semiconductor devices described in the above embodiment are arranged in matrix will be described.

Figure 12:
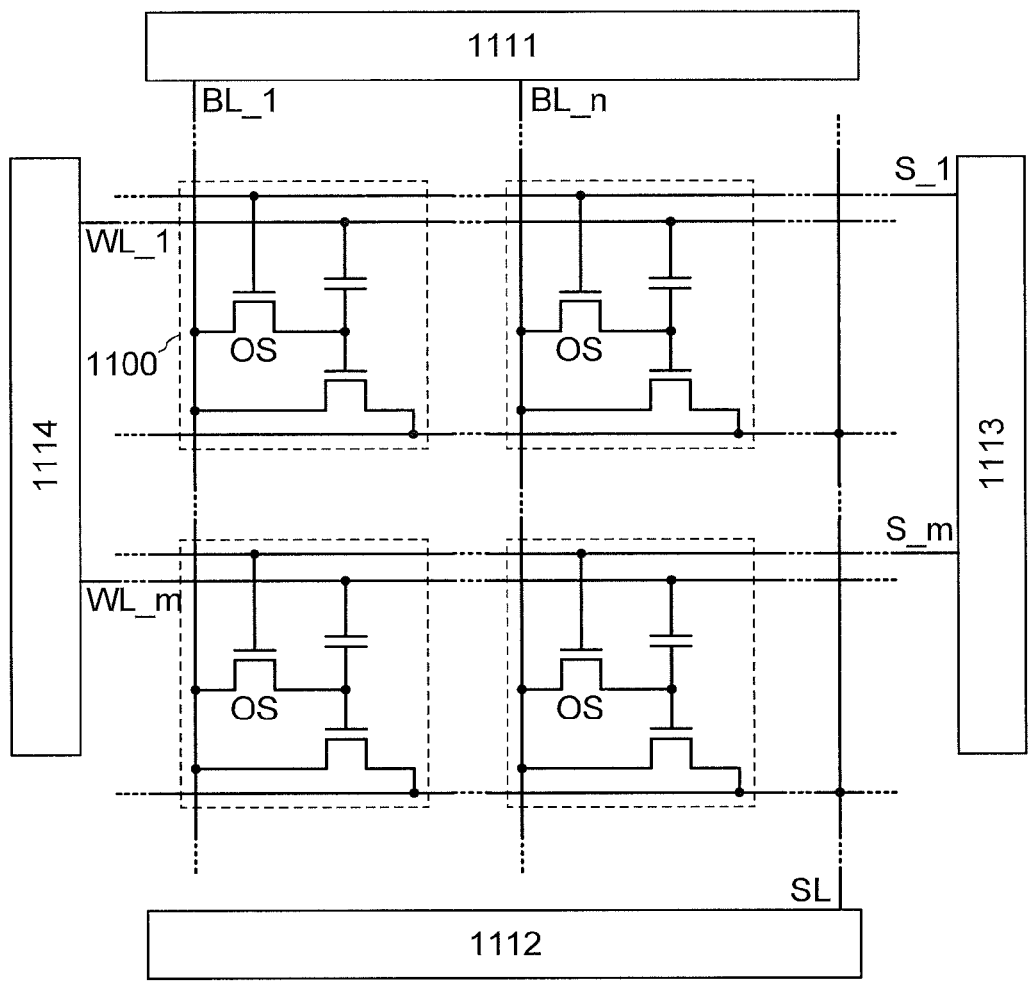
FIG. 12 is a circuit diagram of a semiconductor device.

FIG. 12 is an example of a circuit diagram of a semiconductor device having a storage capacity of (m×n) bits.

The semiconductor device according to an embodiment of the present invention includes a memory cell array which includes m (m is an integer of greater than or equal to 2) signal lines S, m word lines WL, n (n is an integer of greater than or equal to 2) bit lines BL, k (k is a natural number of less than n) source lines SL, and memory cells 1100 arranged in matrix of m (rows) (in a vertical direction)×n (columns) (in a horizontal direction); and peripheral circuits such as a first driver circuit 1111, a second driver circuit 1112, a third driver circuit 1113, and a fourth driver circuit 1114. Here, the structure described in the above embodiment (the structure in FIG. 11A-1) is applied to the memory cell 1100.

Each of the memory cells 1100 includes a first transistor, a second transistor, and a capacitor. In each of the memory cells 1100, a gate electrode of the first transistor, one of a source electrode and a drain electrode of the second transistor, and one electrode of the capacitor are electrically connected to each other, and the source line SL and a source electrode (a source region) of the first transistor are electrically connected to each other. Furthermore, the bit line BL, the other of the source electrode and the drain electrode of the second transistor, and a drain electrode of the first transistor are electrically connected to each other. The word line WL and the other electrode of the capacitor are electrically connected to each other. The signal line S and a gate electrode of the second transistor are electrically connected to each other. In other words, the source line SL corresponds to the first wiring (the 1st line) in the structure illustrated in FIG. 11A-1, the bit line BL corresponds to the second wiring (the 2nd line) and the third wiring (the 3rd line), the signal line S corresponds to the fourth wiring (the 4th line), and the word line WL corresponds to the fifth wiring (the 5th line).

In the memory cell array illustrated in FIG. 12, the bit lines BL, the source lines SL, the word lines WL, and the signal lines S form the matrix arrangement. To one of the bit lines BL, m memory cells 1100 arranged in the same column are connected. In addition, n memory cells 1100 arranged in the same row are connected to one of the word lines WL and one of the signal lines S. Further, the number of the source lines SL is smaller than that of the bit lines BL; therefore, a plurality of memory cells including at least the memory cells 1100 connected to different bit lines BL need to be connected to one of the source lines SL. In other words, j (j is an integer of greater than or equal to (m+1) and less than or equal to (m×n)) memory cells 1100 are connected to one of the source lines SL. Note that source regions of the first transistors included in the plurality of memory cells 1100 connected to one of the source line SL are formed in the same layer. Note that it is preferable that the source line SL be arranged in the proportion of one to a plurality of bit lines BL (i.e., (n/k) is an integer). In that case, if an equal number of the memory cells 1100 is connected to each source line SL, (m×n/k) memory cells 1100 are connected to one of the source lines SL.

As in the memory cell array illustrated in FIG. 12, one of the source lines SL which connects one of the memory cells 1100 to another memory cell is connected to a plurality of memory cells 1100 including at least the memory cells connected to different bit lines BL to make the number of source lines SL smaller than that of bit lines BL, whereby the number of source lines can be made sufficiently small; thus, the degree of integration of the semiconductor device can be increased.

The bit lines BL are electrically connected to the first driver circuit 1111. The source lines SL are electrically connected to the second driver circuit 1112. The signal lines S are electrically connected to the third driver circuit 1113. The word lines WL are electrically connected to the fourth driver circuit 1114. Note that here, the first driver circuit 1111, the second driver circuit 1112, the third driver circuit 1113, and the fourth driver circuit 1114 are separately provided; however, the invention disclosed herein is not limited to this. A driver circuit having any one or more of the functions may alternatively be used.

Figure 13:
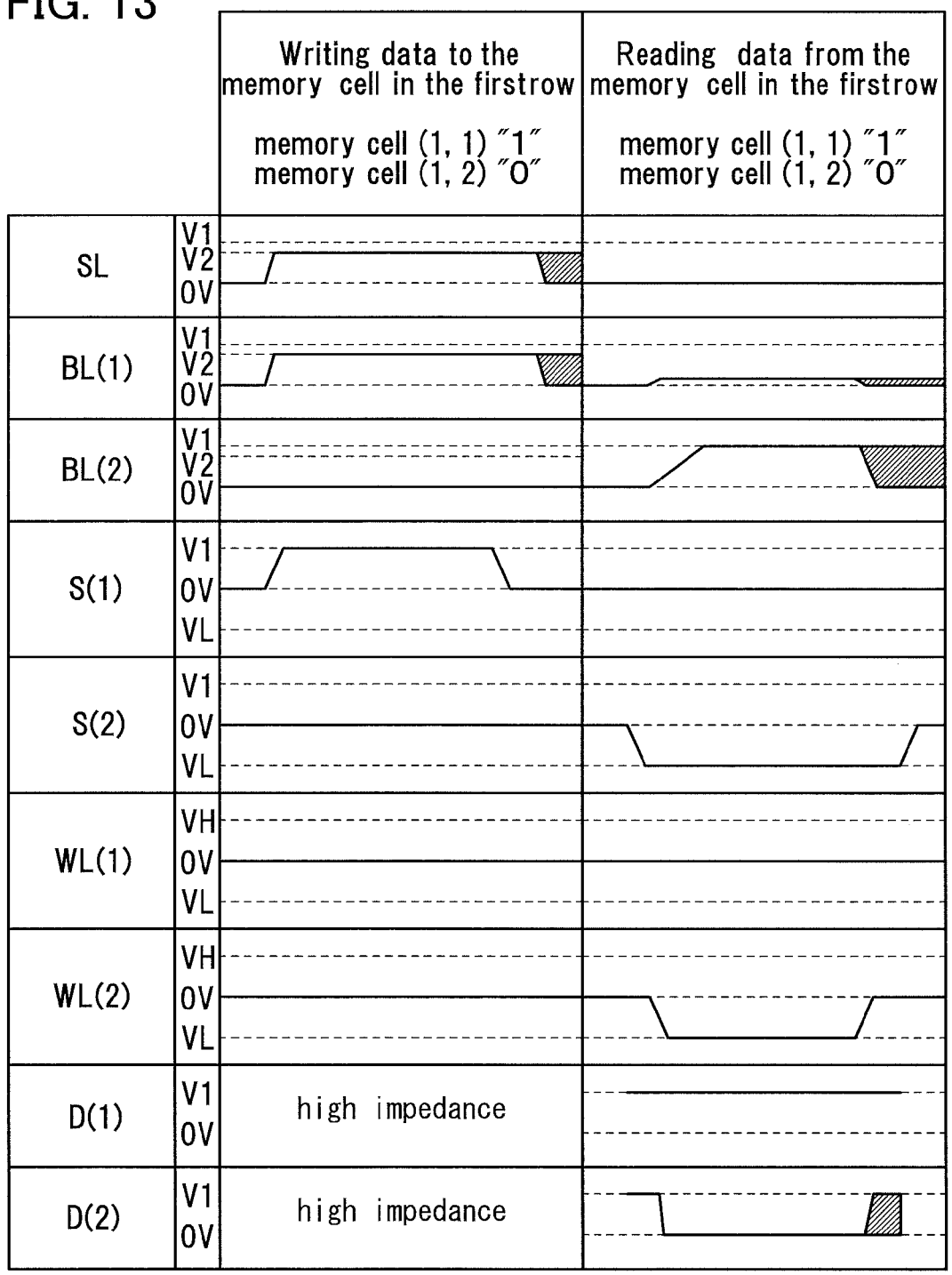
FIG. 13 is a timing chart.

Next, writing operation and reading operation will be described. FIG. 13 is an example of a timing chart of writing operation and reading operation of the semiconductor device illustrated in FIG. 12.

Although operation of a semiconductor device including a memory cell array of two rows and two columns will be described for simplification here, the invention disclosed herein is not limited to this.

Writing data to the memory cell 1100 (1,1) and the memory cell 1100 (1,2) which are in the first row and reading data from the memory cell 1100 (1,1) and the memory cell 1100 (1,2) which are in the first row will be described. Note that in the following description, it is assumed that data to be written to the memory cell (1,1) is "1" and data to be written to the memory cell (1,2) is "0".

First, the writing will be described. A potential V1 is supplied to a signal line S(1) of the first row, so that the second transistors of the first row are turned on. Further, a potential of 0 V is supplied to a signal line S(2) of the second row, so that the second transistors of the second row are turned off.

Further, a potential V2 is supplied to a bit line BL(1) of the first column and a potential of 0 V is supplied to a bit line BL(2) of the second column.

As a result, the potential V2 and the potential of 0 V are supplied to a floating gate portion FG of the memory cell (1,1) and a floating gate portion FG of the memory cell (1,2), respectively. Here, the potential V2 is higher than the threshold voltage of the first transistor. Then, the potential of the signal line S(1) of the first row is set to 0 V, so that the second transistors of the first row are turned off. Thus, the writing is completed. It is preferable that the potential V2 be substantially equal to the potential V1 or less than or equal to the potential V1.

Note that a word line WL(1) of the first row and a word line WL(2) of the second row are at the potential of 0 V during the writing operation. At the end of the writing, before the potential of the bit line BL(1) of the first column is changed, the potential of the signal line S(1) of the first row is set to 0 V. After writing, the threshold voltage of the memory cell is Vw0 in the case of data "0" and Vw1 in the case of data "1". Here, the threshold voltage of the memory cell means voltage of a terminal connected to the word line WL, which changes resistance between the source electrode and the drain electrode of the first transistor. Note that Vw0>0>Vw1 is satisfied.

Then, the reading will be described. Here, the bit line BL is electrically connected to a reading circuit illustrated in FIG. 14.

First, the potential of 0 V and a potential VL are supplied to the word line WL(1) of the first row and the word line WL(2) of the second row, respectively. The potential VL is lower than the threshold voltage Vw1. When the word line WL(1) is at the potential of 0 V, in the first row, the first transistor of the memory cell in which data "0" is held is turned off, and the first transistor of the memory cell in which data "1" is held is turned on. When the word line WL(2) is at the potential VL, in the second row, the first transistors of the memory cells in which either data "0" or data "1" is held are off.

As a result, the first transistor of the memory cell (1,1) between the bit line BL(1) and the source line SL(1) is turned on, thereby having low resistance, and the first transistor of the memory cell (1,2) between the bit line BL(2) and the source line SL(1) is turned off, thereby having high resistance. The reading circuit connected to the bit line BL(1) and the bit line BL(2) can read data on the basis of a difference in resistance between the bit lines BL.

Note that during reading operation, the potential of 0 V and the potential VL are supplied to the signal line S(1) and the signal line S(2), respectively, so that all the second transistors are turned off. The potential of the floating gate portion FG of the first row is 0 V or V2; thus, the potential of the signal line S(1) is set to the potential of 0 V, whereby all the second transistors can be turned off. On the other hand, the potential of the floating gate portion FG of the second row is lower than the potential at the time immediately after data writing if the potential VL is supplied to the word line WL(2). Therefore, in order to prevent the second transistor from being turned on, the potential of the signal line S(2) is set to low (the potential VL) similarly to the potential of the word line WL(2). That is, the potentials of the signal line S and the word line WL in the row where data is not read are set to the same potential (the potential VL). Thus, all the second transistors can be turned off.

Figure 14:
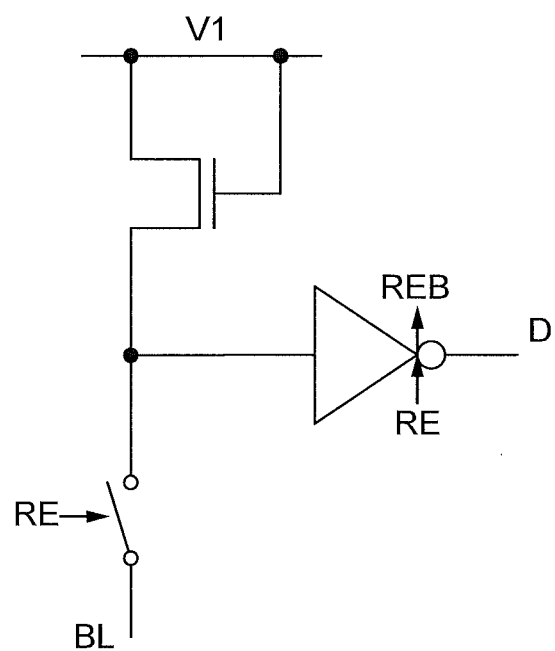
FIG. 14 is a circuit diagram of a semiconductor device.

Next, an output potential in the case where the circuit in FIG. 14 is used as a reading circuit will be described. In the reading circuit illustrated in FIG. 14, the bit line BL is connected to a clocked inverter and a transistor which is diode-connected to a wiring to which the potential V1 is supplied through a switching element controlled by a read enable signal (RE signal). Further, a fixed potential (e.g., 0 V) is supplied to the source line SL. Since the resistance between the bit line BL(1) and the source line SL is low, a low potential is input to the clocked inverter and an output D(1) is High. Since the resistance between the bit line BL(2) and the source line SL is high, a high potential is supplied to the clocked inverter and an output D(2) is Low.

The operation potentials can be set to V1=2 V, V2=1.5 V, VH=2V, and VL=−2 V, for example.

Figure 15:
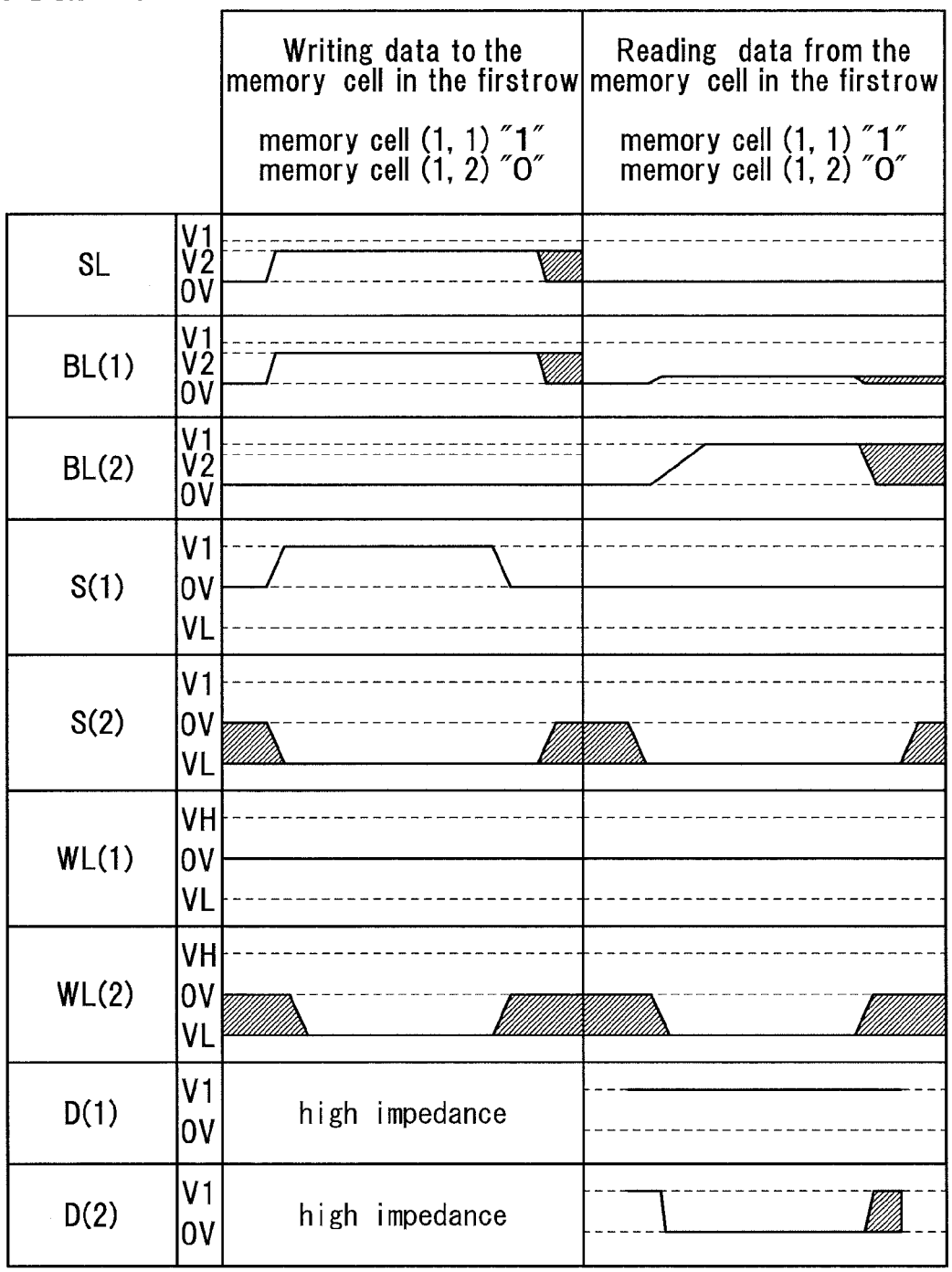
FIG. 15 is a timing chart.

Next, writing operation which is different from the above-described writing operation will be described. Data to be written is the same as that in the above-described writing operation. FIG. 15 is an example of a timing chart of the writing operation and reading operation.

In the writing based on the timing chart of FIG. 13 (i.e., writing to the first row), the potential of the word line WL(2) at the time of writing is set to the potential of 0 V; thus, for example, in the case where data which has been written to the memory cell (2,1) or the memory cell (2,2) is data "1", stationary current flows between the bit line BL(1) and the bit line BL(2). That is because at the time of the writing to the first row, the first transistors in the memory cells of the second row are turned on, whereby the bit line BL(1) and the bit line BL(2) are connected at low resistance through the source line. In the writing operation illustrated in FIG. 15, such stationary current is prevented from being generated.

The potential V1 is supplied to the signal line S(1) of the first row, so that the second transistors of the first row are turned on. Further, the potential of 0 V is supplied to the signal line S(2) of the second row, so that the second transistors of the second row are turned off.

Further, the potential V2 is supplied to the bit line BL(1) of the first column and the potential of 0 V is supplied to the bit line BL(2) of the second column.

As a result, the potential V2 and the potential of 0 V are supplied to the floating gate portion FG of the memory cell (1,1) and the floating gate portion FG of the memory cell (1,2), respectively. Here, the potential V2 is higher than the threshold voltage of the first transistor. Then, the potential of the signal line S(1) of the first row is set to 0 V, so that the second transistors of the first row are turned off. Thus, the writing is completed.

Note that the word line WL(1) of the first row is at the potential of 0 V and the word line WL(2) of the second row is at the potential VL during the writing operation. When the word line WL(2) of the second row is at the potential VL, in the second row, the first transistors of the memory cells in which either data "0" or data "1" is held are in an off state. Further, the potential V2 is supplied to the source line SL during the writing operation. In the case where all the written data are data "0", the potential of 0 V may be supplied to the source line.

At the end of the writing, before the potential of the bit line BL(1) of the first column is changed, the potential of the signal line S(1) of the first row is set to 0 V. After writing, the threshold voltage of the memory cell is Vw0 in the case of data "0" and Vw1 in the case of data "1". Note that Vw0>0>Vw1 is satisfied here.

In the writing operation, the first transistors in the memory cells of the row where data is not to be written (in this case, the second row) are off. Thus, only the memory cells of the row where data is to be written have a problem of stationary current between the bit line and the source line. In the case where data "0" is written to the memory cell of the row where data is to be written, the first transistor in the memory cell is off; thus, a problem of stationary current does not occur. On the other hand, in the case where data "1" is written to the memory cell of the row where data is to be written, the first transistor in the memory cell is on; thus, stationary current occurs if there is a potential difference between the source line SL and the bit line BL (in this case, the bit line BL(1)). Thus, the potential of the source line SL is made to be equal to the potential V2 of the bit line BL(1), whereby stationary current between the bit line and the source line can be prevented.

As described above, generation of stationary current at the time of writing can be prevented by the writing operation. In other words, power consumed at the time of the writing operation can be sufficiently reduced.

Note that the reading operation is performed in a manner similar to that of the above-described reading operation.

A semiconductor device including an oxide semiconductor, whose off-state current is extremely small, is used as the semiconductor device illustrated in FIG. 12, whereby stored data can be held for an extremely long time. In other words, power consumption can be adequately reduced because refresh operation becomes unnecessary or the frequency of refresh operation can be extremely low. Moreover, stored data can be held for a long time even when power is not supplied.

Further, in the semiconductor device illustrated in FIG. 12, high voltage is not needed for writing data and there is no problem of deterioration of elements. Therefore, the semiconductor device illustrated in FIG. 12 does not have a limitation on the number of times of rewritings, which has been a problem in a conventional non-volatile memory; thus, the reliability thereof is drastically improved. Furthermore, since data is written by turning on or off the transistor, high-speed operation can be easily realized. In addition, there is no need of operation for erasing data.

Since a transistor including a material other than an oxide semiconductor can operate at sufficiently high speed, a semiconductor device can perform operation (e.g., reading data) at sufficiently high speed in combination with a transistor including an oxide semiconductor. Further, a transistor including a material other than an oxide semiconductor can favorably realize a variety of circuits (such as a logic circuit or a driver circuit) which are required to operate at high speed.

A semiconductor device with a novel feature can be realized by including both the transistor including a material other than an oxide semiconductor and the transistor including an oxide semiconductor.

Furthermore, in the semiconductor device illustrated in FIG. 12, the number of wirings per memory cell can be reduced. Thus, the area of memory cells can be reduced and storage capacity per unit area of the semiconductor device can be increased.

The structures, methods, and the like described in this embodiment can be combined as appropriate with any of the structures, methods, and the like described in other embodiments.

Embodiment 5

In this embodiment, the cases where the semiconductor device described in any of the above embodiments is applied to an electronic device will be described with reference to FIGS. 16A to 16F. In this embodiment, examples of the electronic device to which the above semiconductor device is applied include a computer, a mobile phone (also referred to as a mobile telephone or a mobile phone device), a personal digital assistant (including a portable game machine, an audio reproducing device, and the like), a camera such as a digital camera or a digital video camera, an electronic paper, and a television device (also referred to as a television or a television receiver).

Figure 16A:
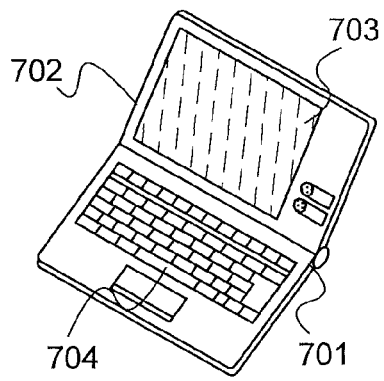
FIGS. 16A to 16F are diagrams illustrating electronic devices each including a semiconductor device.

FIG. 16A illustrates a laptop computer including a housing 701, a housing 702, a display portion 703, a keyboard 704, and the like. The semiconductor device described in any of the above embodiments is provided in at least one of the housing 701 and the housing 702. Therefore, a laptop personal computer in which writing and reading of data are performed at high speed, data is stored for a long time, and power consumption is sufficiently reduced can be realized.

Figure 16D:
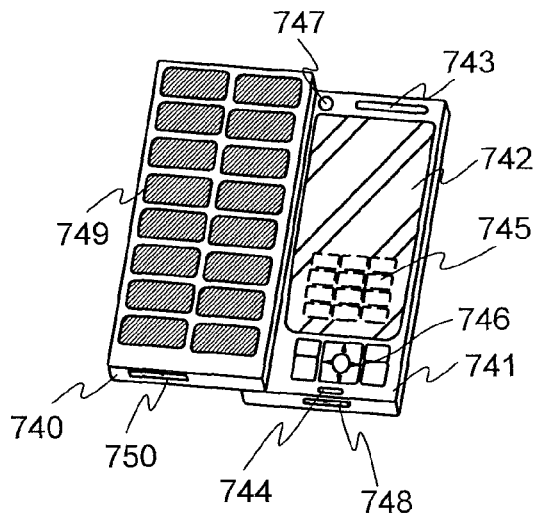
Figure 16B:
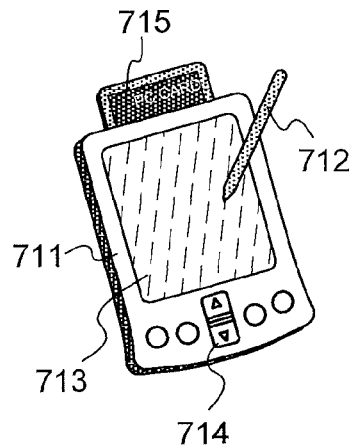

FIG. 16B illustrates a personal digital assistant (PDA). A main body 711 is provided with a display portion 713, an external interface 715, operation buttons 714, and the like. Further, a stylus 712 and the like for operation of the personal digital assistant are provided. In the main body 711, the semiconductor device described in any of the above embodiments is provided. Therefore, a personal digital assistant in which writing and reading of data are performed at high speed, data is stored for a long time, and power consumption is sufficiently reduced can be realized.

Figure 16E:
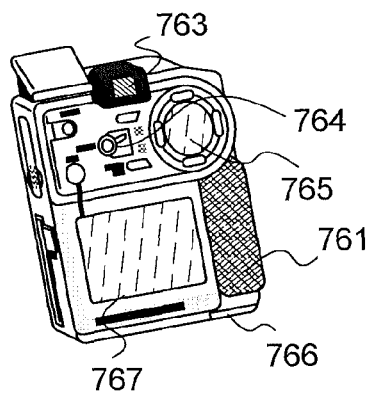
Figure 16C:
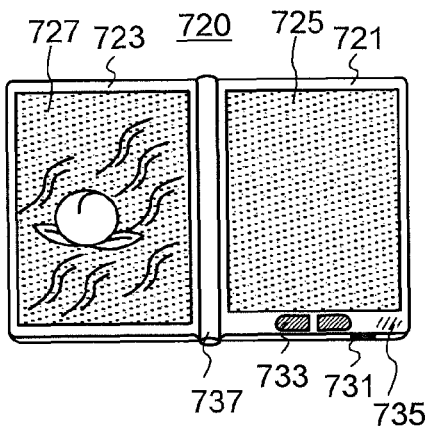

FIG. 16C illustrates an e-book reader 720 provided with an electronic paper, which includes two housings, a housing 721 and a housing 723. The housing 721 and the housing 723 are provided with a display portion 725 and a display portion 727, respectively. The housing 721 and the housing 723 are connected by a hinge portion 737 and can be opened or closed with the hinge portion 737 as an axis. The housing 721 is provided with a power supply switch 731, an operation key 733, a speaker 735, and the like. At least one of the housing 721 and the housing 723 is provided with the semiconductor device described in any of the above embodiments. Therefore, an e-book reader in which writing and reading of data are performed at high speed, data is stored for a long time, and power consumption is sufficiently reduced can be realized.

FIG. 16D illustrates a mobile phone including two housings of a housing 740 and a housing 741. Further, the housing 740 and the housing 741 in a state where they are developed as illustrated in FIG. 16D can shift by sliding to a state where one is lapped over the other; therefore, the size of the mobile phone can be reduced, which makes the mobile phone suitable for being carried. The housing 741 includes a display panel 742, a speaker 743, a microphone 744, an operation key 745, a pointing device 746, a camera lens 747, an external connection terminal 748, and the like. The housing 740 includes a solar cell 749 for charging the mobile phone, an external memory slot 750, and the like. In addition, an antenna is incorporated in the housing 741. At least one of the housing 740 and the housing 741 is provided with the semiconductor device described in any of the above embodiments.

Therefore, a mobile phone in which writing and reading of data are performed at high speed, data is stored for a long time, and power consumption is sufficiently reduced can be realized.

FIG. 16E illustrates a digital camera including a main body 761, a display portion 767, an eyepiece 763, an operation switch 764, a display portion 765, a battery 766, and the like. In the main body 761, the semiconductor device described in any of the above embodiments is provided. Therefore, a digital camera in which writing and reading of data are performed at high speed, data is stored for a long time, and power consumption is sufficiently reduced can be realized.

Figure 16F:
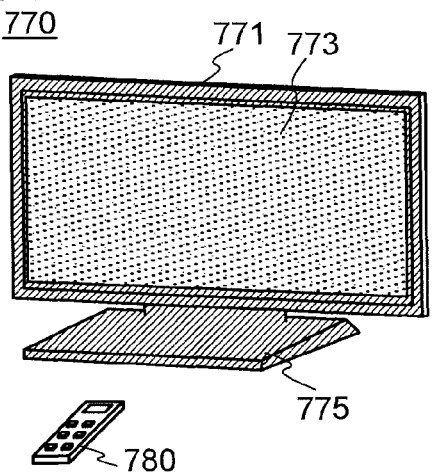

FIG. 16F illustrates a television device 770 including a housing 771, a display portion 773, a stand 775, and the like. The television device 770 can be operated with a switch of the housing 771 or a remote controller 780. The semiconductor device described in any of the above embodiments is mounted on the housing 771 and the remote controller 780. Therefore, a television device in which writing and reading of data are performed at high speed, data is stored for a long time, and power consumption is sufficiently reduced can be realized.

As described above, the electronic devices described in this embodiment each include the semiconductor device according to any of the above embodiments. Therefore, electronic devices with low power consumption can be realized.

This application is based on Japanese Patent Application serial no. 2010-129181 filed with Japan Patent Office on Jun. 4, 2010, the entire contents of which are hereby incorporated by reference.

What is claimed is:

1. A semiconductor device comprising:
a first transistor;
a second transistor having a portion which overlaps with the first transistor; and
an insulating film over a part of the first transistor,
wherein the first transistor comprises:
   a first channel formation region;
   a first gate insulating layer provided over the first channel formation region;
   a first gate electrode provided over the first gate insulating layer so as to overlap with the first channel formation region; and
   a first source electrode and a first drain electrode electrically connected to the first channel formation region,
wherein the second transistor comprises:
   a second channel formation region over the insulating film;
   a second source electrode and a second drain electrode electrically connected to the second channel formation region;
   a second gate electrode provided so as to overlap with the second channel formation region; and
   a second gate insulating layer provided between the second channel formation region and the second gate electrode,
wherein the first gate electrode is surrounded by the insulating film and the insulating film does not cover a top surface of the first gate electrode, and
wherein the second source electrode is formed of a material having etching selectivity with respect to the first gate electrode and the second source electrode is provided on and in contact with the top surface of the first gate electrode.

2. The semiconductor device according to claim 1, wherein the first channel formation region comprises silicon.

3. The semiconductor device according to claim 1, wherein the second channel formation region comprises an oxide semiconductor.

4. The semiconductor device according to claim 1, wherein the etching selectivity of the second source electrode with respect to the first gate electrode is greater than or equal to 2.

5. The semiconductor device according to claim 1, wherein the first gate electrode comprises a material selected from the group consisting of aluminum, copper, titanium, tantalum, and tungsten.

6. The semiconductor device according to claim 1, wherein the second source electrode comprises a material selected from the group consisting of aluminum, chromium, copper, tantalum, titanium, molybdenum, tungsten, and an alloy containing any of these elements.

7. A semiconductor device comprising:
a plurality of memory cells, each memory cell comprising:
   a first transistor;
   a second transistor having a portion which overlaps with the first transistor;
   an insulating film over a part of the first transistor; and
   a capacitor,
wherein the first transistor comprises:
   a first channel formation region;
   a first gate insulating layer provided over the first channel formation region;
   a first gate electrode provided over the first gate insulating layer so as to overlap with the first channel formation region; and
   a first source electrode and a first drain electrode electrically connected to the first channel formation region,
wherein the second transistor comprises:
   a second channel formation region over the insulating film;
   a second source electrode and a second drain electrode electrically connected to the second channel formation region;
   a second gate electrode provided so as to overlap with the second channel formation region; and
   a second gate insulating layer provided between the second channel formation region and the second gate electrode,
wherein the first gate electrode is surrounded by the insulating film and the insulating film does not cover a top surface of the first gate electrode,
wherein the second source electrode is formed of a material having etching selectivity with respect to the first gate electrode, and the second source electrode is provided on and in contact with the top surface of the first gate electrode, and
wherein the first gate electrode, the second source electrode, and one electrode of the capacitor are electrically connected to each other.

8. The semiconductor device according to claim 7, wherein the first channel formation region comprises silicon.

9. The semiconductor device according to claim 7, wherein the second channel formation region comprises an oxide semiconductor.

10. The semiconductor device according to claim 7, wherein the etching selectivity of the second source electrode with respect to the first gate electrode is greater than or equal to 2.

11. The semiconductor device according to claim 7, wherein the first gate electrode comprises a material selected from the group consisting of aluminum, copper, titanium, tantalum, and tungsten.

12. The semiconductor device according to claim 7, wherein the second source electrode comprises a material selected from the group consisting of aluminum, chromium, copper, tantalum, titanium, molybdenum, tungsten, and an alloy containing any of these elements.

13. A semiconductor device comprising:
a first transistor;
a second transistor having a portion which overlaps with the first transistor;
an insulating film over a part of the first transistor; and
a capacitor,
wherein the first transistor comprises:
a first channel formation region;
a first gate insulating layer provided over the first channel formation region;
a first gate electrode provided over the first gate insulating layer so as to overlap with the first channel formation region; and
a first source electrode and a first drain electrode electrically connected to the first channel formation region,
wherein the second transistor comprises:
a second channel formation region over the insulating film;
a second source electrode and a second drain electrode electrically connected to the second channel formation region;
a second gate electrode provided so as to overlap with the second channel formation region; and
a second gate insulating layer provided between the second channel formation region and the second gate electrode,
wherein the first gate electrode is surrounded by the insulating film and the insulating film does not cover a top surface of the first gate electrode,
wherein the second source electrode is formed of a material having etching selectivity with respect to the first gate electrode, and the second source electrode is provided on and in contact with the top surface of the first gate electrode, and
wherein the second gate insulating layer is sandwiched between a first electrode of the capacitor and a second electrode of the capacitor, wherein the second electrode of the capacitor is the second source electrode.

14. The semiconductor device according to claim 13, wherein the first channel formation region comprises silicon.

15. The semiconductor device according to claim 13, wherein the second channel formation region comprises an oxide semiconductor.

16. The semiconductor device according to claim 13, wherein the etching selectivity of the second source electrode with respect to the first gate electrode is greater than or equal to 2.

17. The semiconductor device according to claim 13, wherein the first gate electrode comprises a material selected from the group consisting of aluminum, copper, titanium, tantalum, and tungsten.

18. The semiconductor device according to claim 13, wherein the second source electrode comprises a material selected from the group consisting of aluminum, chromium, copper, tantalum, titanium, molybdenum, tungsten, and an alloy containing any of these elements.

19. A semiconductor device comprising:
a plurality of memory cells, each of the plurality of memory cells comprising:
a first transistor;
a second transistor having a portion which overlaps with the first transistor;
an insulating film over a part of the first transistor; and
a capacitor,
wherein the first transistor comprises:
a first channel formation region;
a first gate insulating layer provided over the first channel formation region;
a first gate electrode provided over the first gate insulating layer so as to overlap with the first channel formation region; and
a first source electrode and a first drain electrode electrically connected to the first channel formation region,
wherein the second transistor comprises:
a semiconductor layer comprising a second channel formation region over the insulating film;
a second source electrode and a second drain electrode electrically connected to the second channel formation region;
a second gate electrode provided so as to overlap with the second channel formation region; and
a second gate insulating layer provided between the second channel formation region and the second gate electrode,
wherein the first gate electrode is surrounded by the insulating film and the insulating film does not cover a top surface of the first gate electrode,
wherein the second source electrode is formed of a material having etching selectivity with respect to the first gate electrode, and the second source electrode is provided on and in contact with the top surface of the first gate electrode, and
wherein the semiconductor layer and the second gate insulating layer are sandwiched between a first electrode of the capacitor and a second electrode of the capacitor, wherein the second electrode of the capacitor is the second source electrode.

20. The semiconductor device according to claim 19, wherein the first channel formation region comprises silicon.

21. The semiconductor device according to claim 19, wherein the second channel formation region comprises an oxide semiconductor.

22. The semiconductor device according to claim 19, wherein the etching selectivity of the second source electrode with respect to the first gate electrode is greater than or equal to 2.

23. The semiconductor device according to claim 19, wherein the first gate electrode comprises a material selected from the group consisting of aluminum, copper, titanium, tantalum, and tungsten.

24. The semiconductor device according to claim 19, wherein the second source electrode comprises a material selected from the group consisting of aluminum, chromium, copper, tantalum, titanium, molybdenum, tungsten, and an alloy containing any of these elements.

25. A method of manufacturing a semiconductor device comprising the steps of:
forming a first channel formation region in a semiconductor substrate;

forming a first source region and a first drain region in the semiconductor substrate so that the first channel formation region is sandwiched between the first source region and the first drain region;

forming a first gate insulating layer over the first channel formation region;

forming a first gate electrode over the first gate insulating layer;

forming an insulating film over the first source region and the first drain region;

wherein the first gate electrode is surrounded by the insulating film and the insulating film does not cover a top surface of the first gate electrode;

forming a second channel formation region over the insulating film; and forming a second source electrode on and in contact with the top surface of the first gate electrode and electrically connected to the second channel formation region, wherein the second source electrode comprises a material having etching selectivity with respect to the first gate electrode.

26. The method of manufacturing a semiconductor device according to claim 25, wherein the first channel formation region comprises silicon.

27. The method of manufacturing a semiconductor device according to claim 25, wherein the second channel formation region comprises an oxide semiconductor.

28. The method of manufacturing a semiconductor device according to claim 25, wherein the etching selectivity of the second source electrode with respect to the first gate electrode is greater than or equal to 2.

29. The method of manufacturing a semiconductor device according to claim 25, wherein the first gate electrode comprises a material selected from the group consisting of aluminum, copper, titanium, tantalum, and tungsten.

30. The method of manufacturing a semiconductor device according to claim 25, wherein the second source electrode comprises a material selected from the group consisting of aluminum, chromium, copper, tantalum, titanium, molybdenum, tungsten, and an alloy containing any of these elements.

* * * * *

UNITED STATES PATENT AND TRADEMARK OFFICE
CERTIFICATE OF CORRECTION

PATENT NO. : 8,779,433 B2
APPLICATION NO. : 13/115239
DATED : July 15, 2014
INVENTOR(S) : Atsuo Isobe et al.

It is certified that error appears in the above-identified patent and that said Letters Patent is hereby corrected as shown below:

In the Specification

Column 9, line 27 – replace "fin lied" with --formed--;

Column 10, line 59 – replace "fainted" with --formed--;

Column 14, line 42 – replace "theimal" with --thermal--;

Column 18, line 16 – replace "foiming" with --forming--;

Column 23, line 2 – replace "(RPM)," with --(HPM),--;

Column 23, line 66 – replace "mu" with --nm--;

Column 26, line 51 – replace "fainted" with --formed--;

Column 27, line 37 – replace "fanned" with --formed--;

Column 28, line 58 – replace "farming" with --forming--;

Column 30, line 7 – replace "faulted." with --formed.--;

Column 30, line 32 – replace "fanned" with --formed--;

Column 31, line 51 – replace "ofd-state" with --off-state--;

Column 31, line 53 – replace "of" with --off--;

Column 31, line 56 – after "data" insert --.--; and

Column 32, line 40 – replace "$V_0 (V_{th\_L}),$" with --$V_0 (< V_{th\_L})$,--.

Signed and Sealed this
Second Day of June, 2015

Michelle K. Lee
*Director of the United States Patent and Trademark Office*